US010726922B2

(12) United States Patent
Yang et al.

(10) Patent No.: US 10,726,922 B2
(45) Date of Patent: Jul. 28, 2020

(54) MEMORY DEVICE WITH CONNECTED WORD LINES FOR FAST PROGRAMMING

(71) Applicant: SanDisk Technologies LLC, Addison, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/000,237

(22) Filed: Jun. 5, 2018

(65) Prior Publication Data
US 2019/0371406 A1  Dec. 5, 2019

(51) Int. Cl.
| | |
|---|---|
| *G11C 16/08* | (2006.01) |
| *G11C 16/04* | (2006.01) |
| *G11C 11/56* | (2006.01) |
| *G11C 16/10* | (2006.01) |
| *H01L 27/1157* | (2017.01) |
| *G11C 16/26* | (2006.01) |
| *H01L 27/11582* | (2017.01) |
| *G11C 16/24* | (2006.01) |

(52) U.S. Cl.
CPC .......... *G11C 16/08* (2013.01); *G11C 11/5671* (2013.01); *G11C 16/0483* (2013.01); *G11C 16/10* (2013.01); *G11C 16/26* (2013.01); *H01L 27/1157* (2013.01); *G11C 11/5628* (2013.01); *G11C 11/5642* (2013.01); *G11C 16/24* (2013.01); *H01L 27/11582* (2013.01)

(58) Field of Classification Search
None
See application file for complete search history.

(56) References Cited

U.S. PATENT DOCUMENTS 4,584,674 A * 4/1986 Watanabe ........... G11C 11/4087
365/230.03
5,179,536 A * 1/1993 Kasa ..................... G11C 11/407
365/185.04

(Continued)

OTHER PUBLICATIONS

International Search Report & the Written Opinion of the International Searching Authority dated May 24, 2019, International Application No. PCT/US2019/017392.

*Primary Examiner* — J. H. Hur
(74) *Attorney, Agent, or Firm* — Vierra Magen Marcus LLP

(57) ABSTRACT

Apparatuses and techniques for fast programming and read operations for memory cells. A group of word lines comprising a selected word line and one or more adjacent word lines are driven with a common voltage signal during program and read operations. The word lines may be permanently connected to one another or connected by a switch. In another approach, the word lines are driven separately by common voltage signals. In a set of blocks, one block of memory cells can be provided with connected word lines to provide a relatively high access speed, while another block of memory cells has disconnected word lines to provide a higher storage density. In another aspect, the memory cells of a word line are divided into portions, and a portion which is closest to a row decoder is reserved for high access speed with a low storage density.

23 Claims, 29 Drawing Sheets

(56) References Cited

U.S. PATENT DOCUMENTS

| | | | |
|---|---|---|---|
| 5,335,198 A * | 8/1994 | Van Buskirk | G11C 16/28 |
| | | | 365/185.09 |
| 5,864,496 A | 1/1999 | Mueller et al. | |
| 7,002,825 B2 | 2/2006 | Scheuerlein | |
| 7,170,802 B2 * | 1/2007 | Cernea | G11C 7/1036 |
| | | | 365/185.09 |
| 7,450,414 B2 | 11/2008 | Scheuerlein | |
| 7,577,031 B2 | 8/2009 | Sekar et al. | |
| 7,986,554 B2 | 7/2011 | Li | |
| 8,213,235 B2 | 7/2012 | Kim | |
| 8,861,267 B2 | 10/2014 | Seol et al. | |
| 8,867,272 B2 | 10/2014 | Liu et al. | |
| 8,918,577 B1 | 12/2014 | Gorobets et al. | |
| 9,176,862 B2 | 11/2015 | Chen et al. | |
| 9,229,644 B2 | 1/2016 | Ng et al. | |
| 9,236,139 B1 | 1/2016 | Lai et al. | |
| 9,355,735 B1 * | 5/2016 | Chen | G11C 8/14 |
| 9,514,850 B2 | 12/2016 | Kim | |
| 9,570,174 B2 | 2/2017 | Dor et al. | |
| 9,703,719 B2 | 7/2017 | Balakrishnan et al. | |
| 2002/0136047 A1 | 9/2002 | Scheuerlein | |
| 2005/0117399 A1 * | 6/2005 | Kwon | G11C 8/08 |
| | | | 365/185.28 |
| 2007/0285980 A1 * | 12/2007 | Shimizu | G11C 11/5628 |
| | | | 365/185.03 |
| 2008/0239812 A1 | 10/2008 | Abiko et al. | |
| 2009/0273979 A1 | 11/2009 | Aritome | |
| 2009/0296487 A1 * | 12/2009 | Murin | G11C 11/5642 |
| | | | 365/185.21 |
| 2009/0316479 A1 | 12/2009 | Shibata | |
| 2016/0093402 A1 | 3/2016 | Kitagawa et al. | |
| 2016/0260495 A1 | 9/2016 | Paudel et al. | |

\* cited by examiner

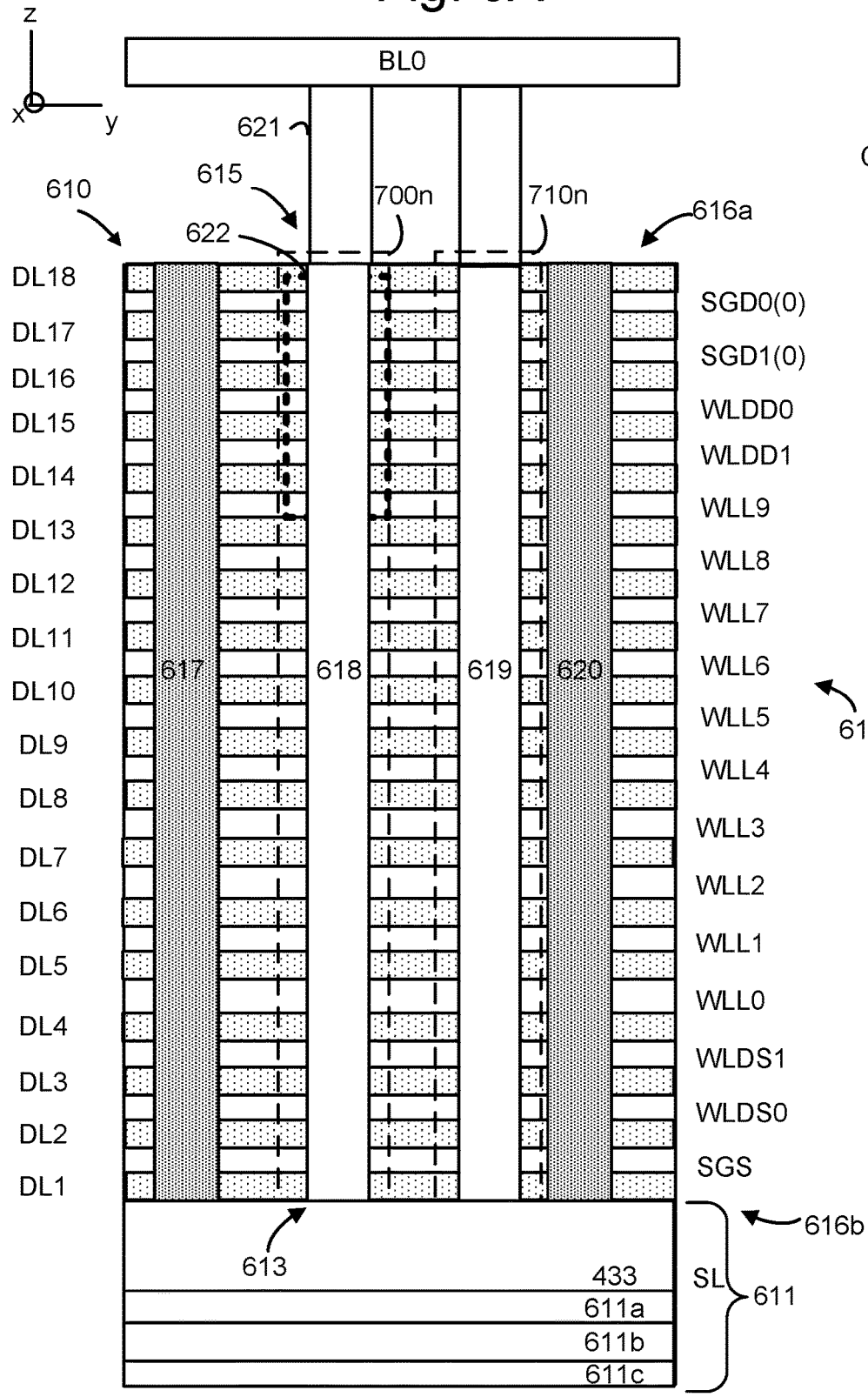
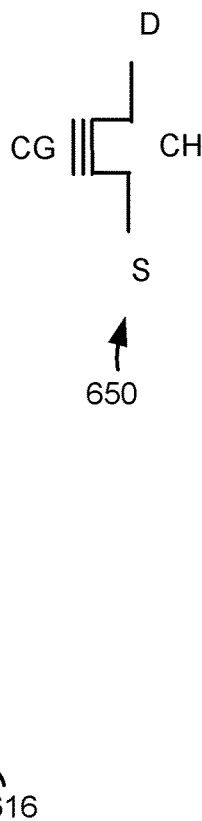
Fig. 5A
Fig. 5B

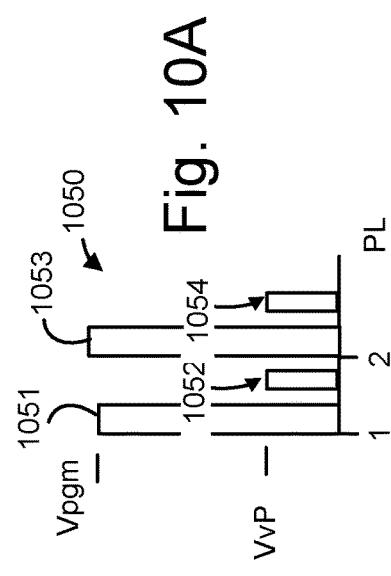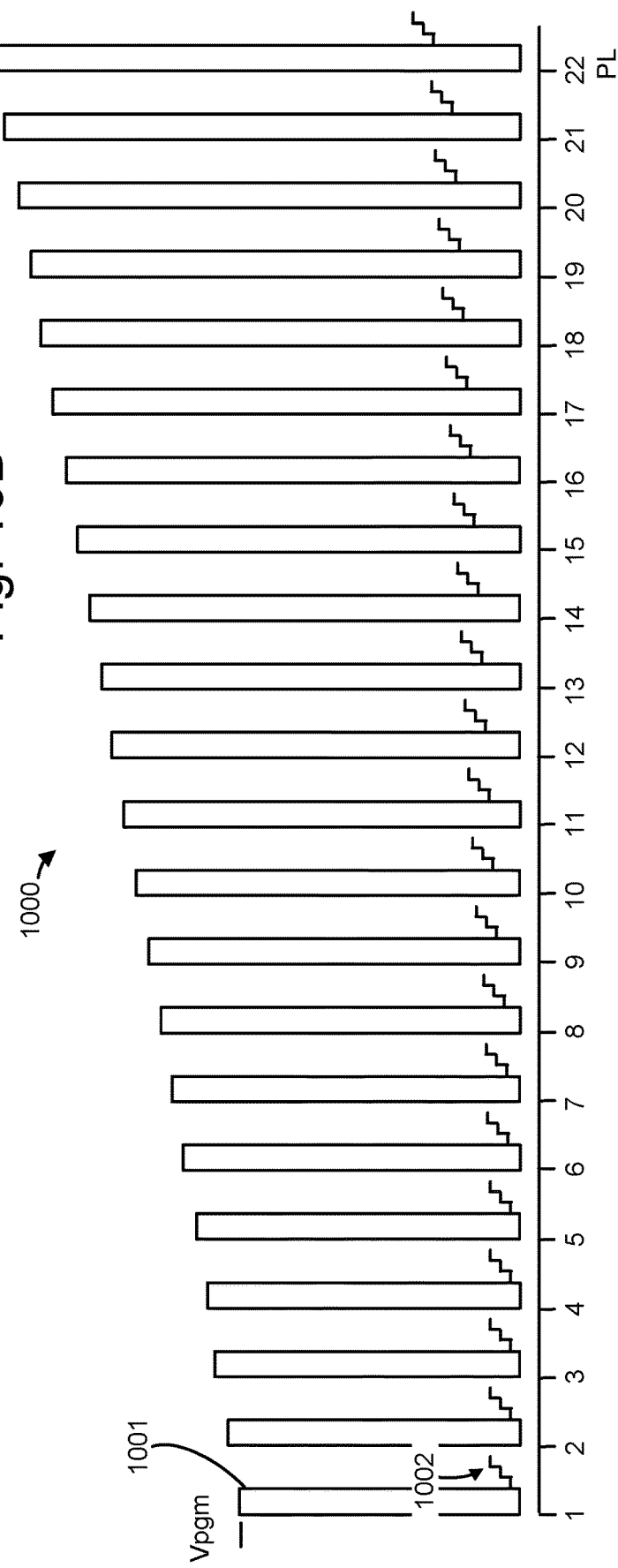

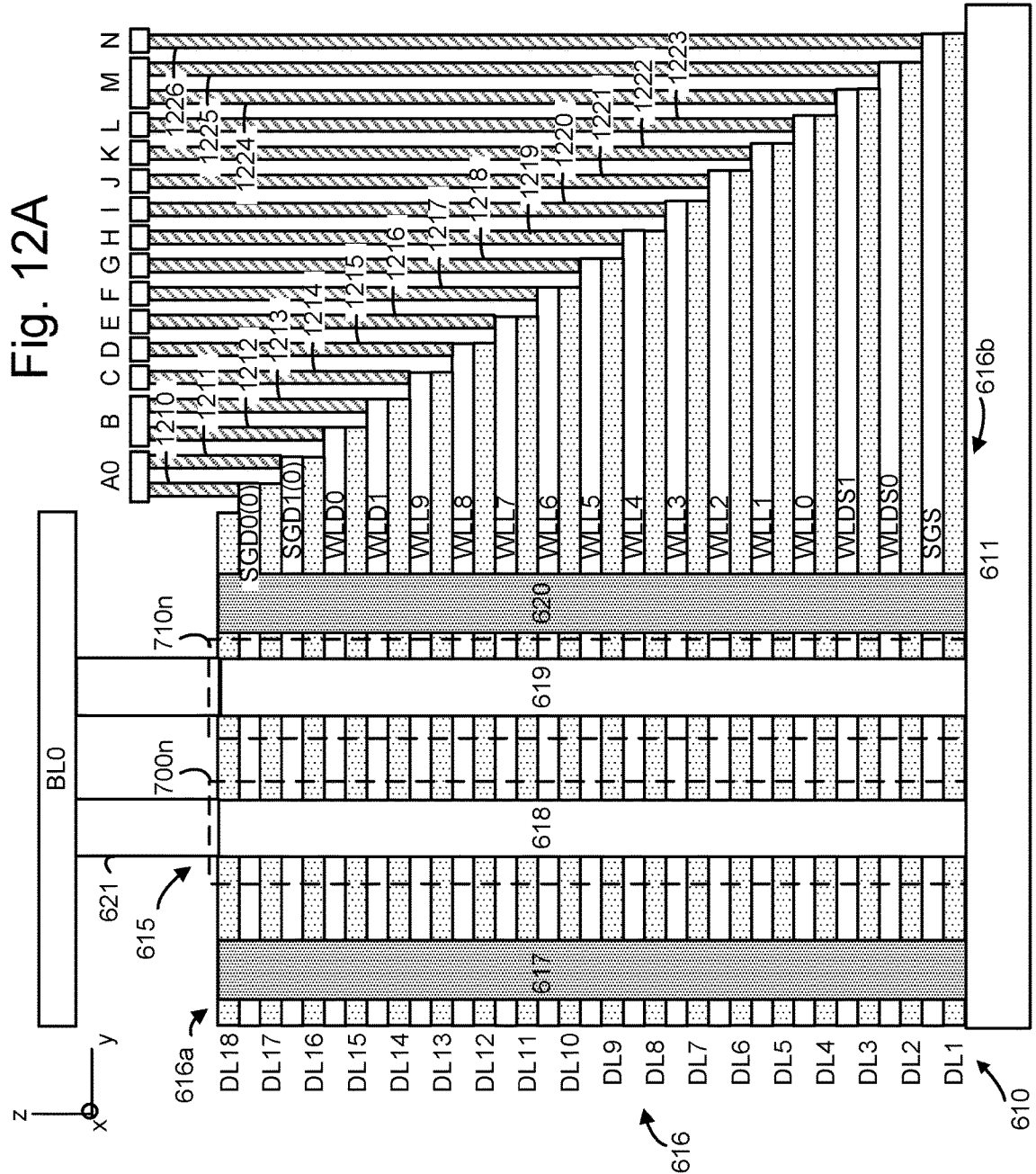

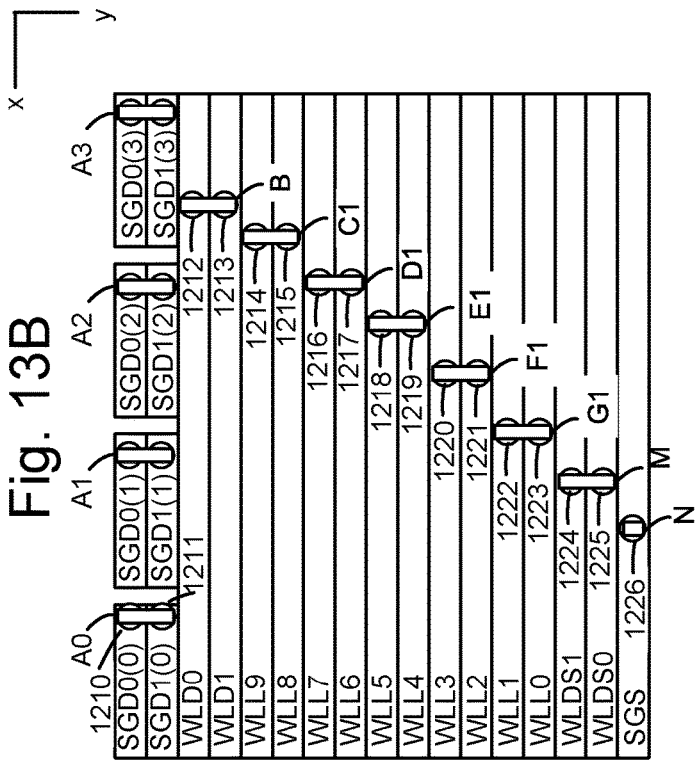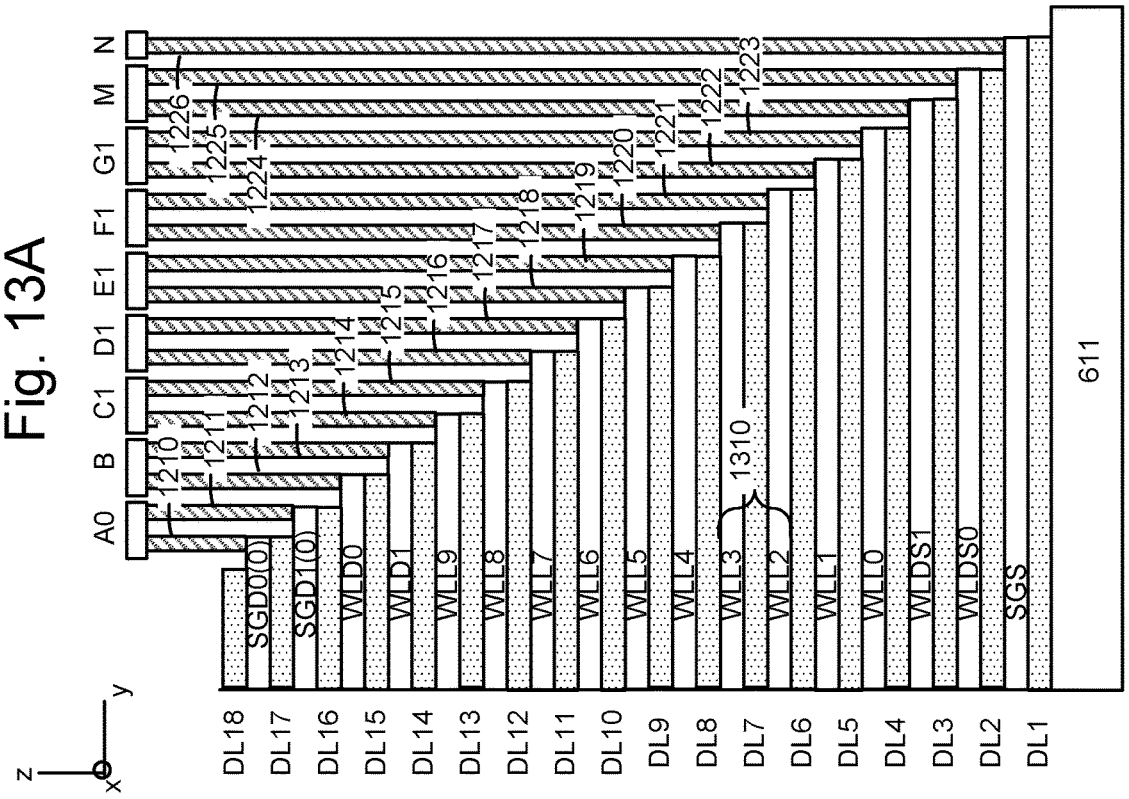

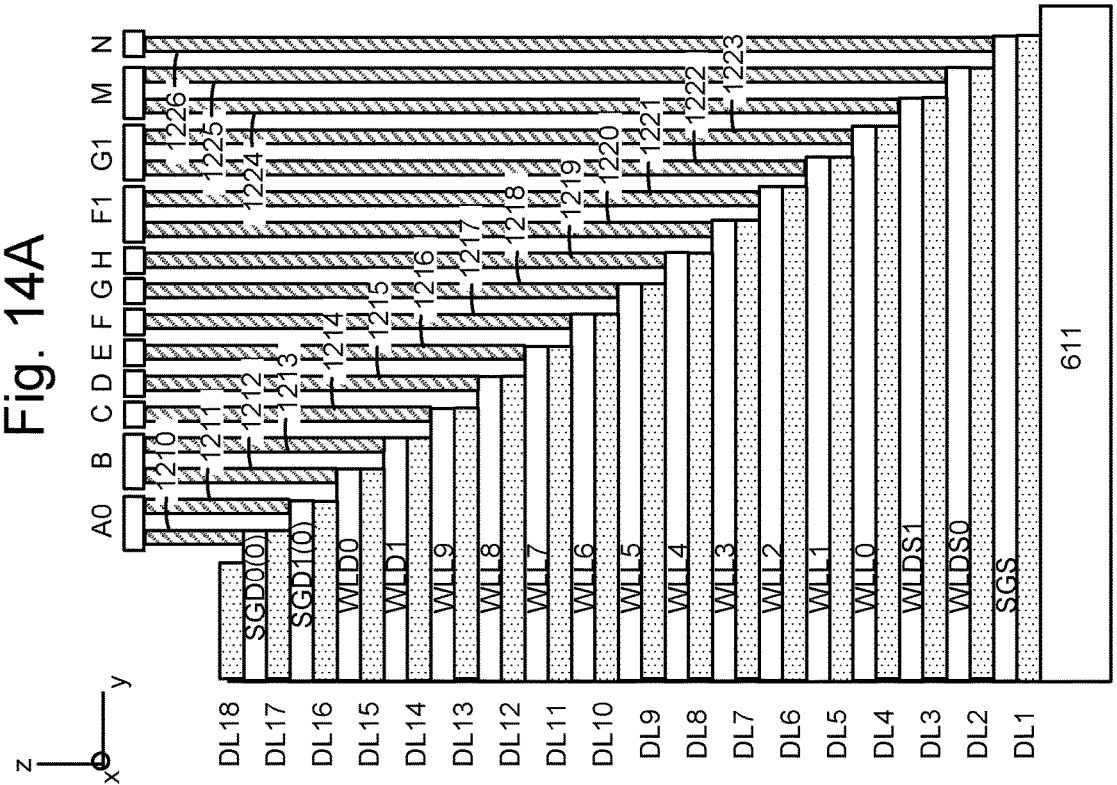

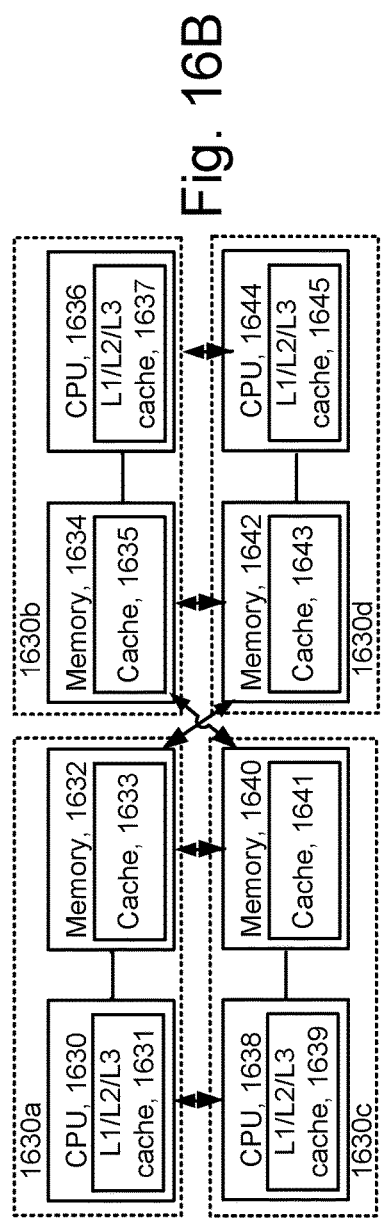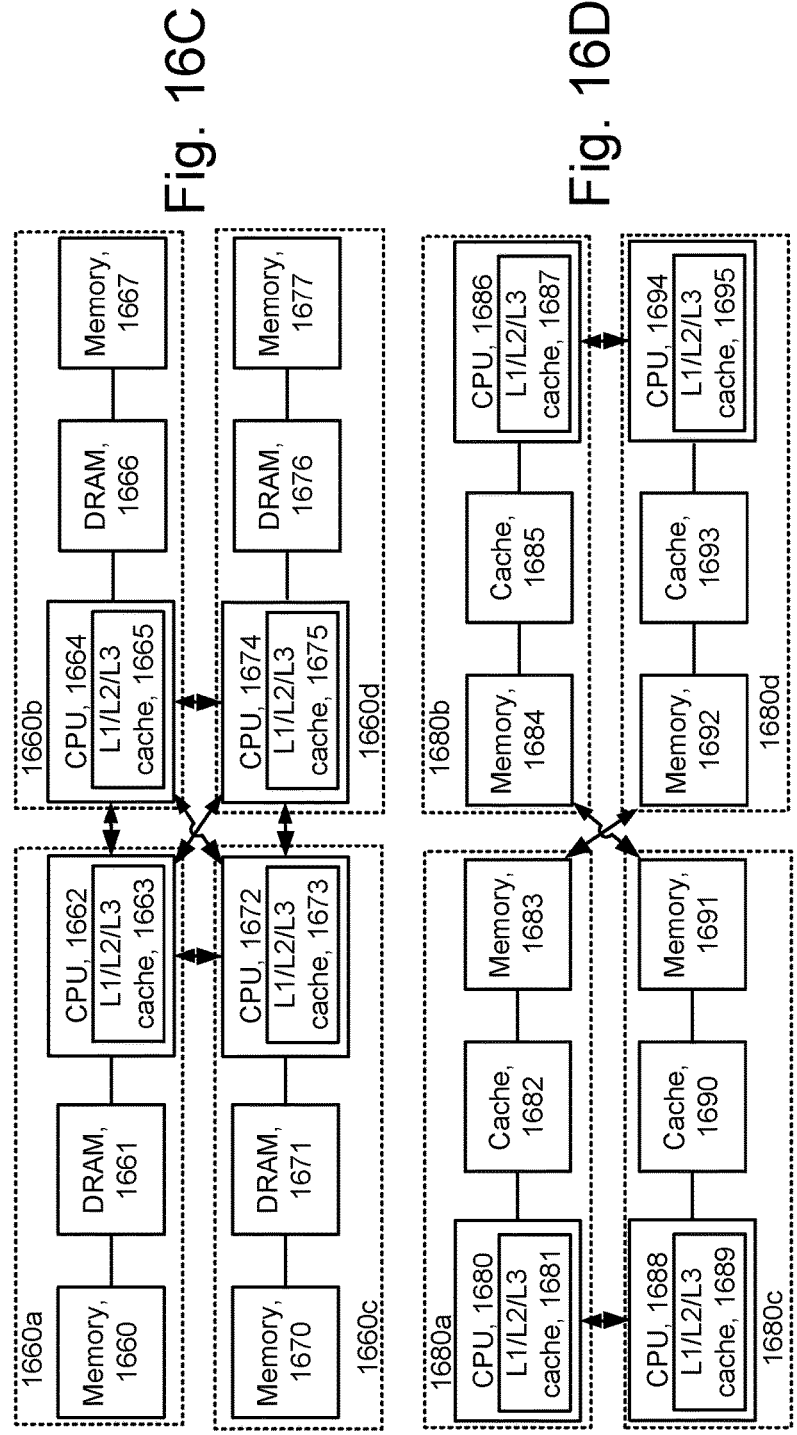

MEMORY DEVICE WITH CONNECTED WORD LINES FOR FAST PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 5A depicts an example cross-sectional view of a portion of BLK0 of FIG. 4.

FIG. 5B depicts an example transistor 650.

FIG. 10A depicts a voltage signal used in a series of program loops in an example program operation for SLC memory cells which results in the Vth distribution of FIG. 9A.

FIG. 10B depicts a voltage signal used in a series of program loops in an example program operation for MLC memory cells which results in the Vth distribution of FIG. 9B.

FIG. 12A depicts a further view of the stack 610 of FIG. 5A showing terraced control gate layers and a first example of connections to contacts, where each word line layer is connected to a separate contact.

FIG. 12B depicts an example of the map 119 of control gate layers to contacts of FIG. 1, consistent with FIG. 12A.

FIG. 12C depicts an example of the map 121 of word lines to pages of data of FIG. 1, consistent with FIG. 12A.

FIG. 13A depicts a further view of the stack 610 of FIG. 5A showing terraced control gate layers and a second example of connections to contacts, where pairs of word line layers WLL0 and WLL1, WLL2 and WLL3, WLL4 and WLL5, WLL6 and WLL7, and WLL8 and WLL9, are connected to separate contacts.

FIG. 13B depicts a top view of the stack of FIG. 13A.

FIG. 13C depicts an example of the map 119 of control gate layers to contacts of FIG. 1, consistent with FIG. 13A.

FIG. 13D depicts an example of the map 121 of word lines to pages of data of FIG. 1, consistent with FIG. 13A.

FIG. 14A depicts a further view of the stack 610 of FIG. 5A showing terraced control gate layers and a third example of connections to contacts, where pairs of word line layers WLL0 and WLL1, and WLL2 and WLL3, are connected to separate contacts, and single word line layers WLL4-WLL9 are connected to separate respective contacts.

FIG. 14B depicts a top view of the stack of FIG. 14A.

FIG. 14C depicts an example of the map 119 of control gate layers to contacts of FIG. 1, consistent with FIG. 14A.

FIG. 14D depicts an example of the map 121 of word lines to pages of data of FIG. 1, consistent with FIG. 14A.

FIG. 16B depicts an example architecture consistent with FIG. 16A.

FIG. 16C depicts an example computing-centric architecture.

FIG. 16D depicts an example memory-centric architecture.

DETAILED DESCRIPTION

Figure 1:
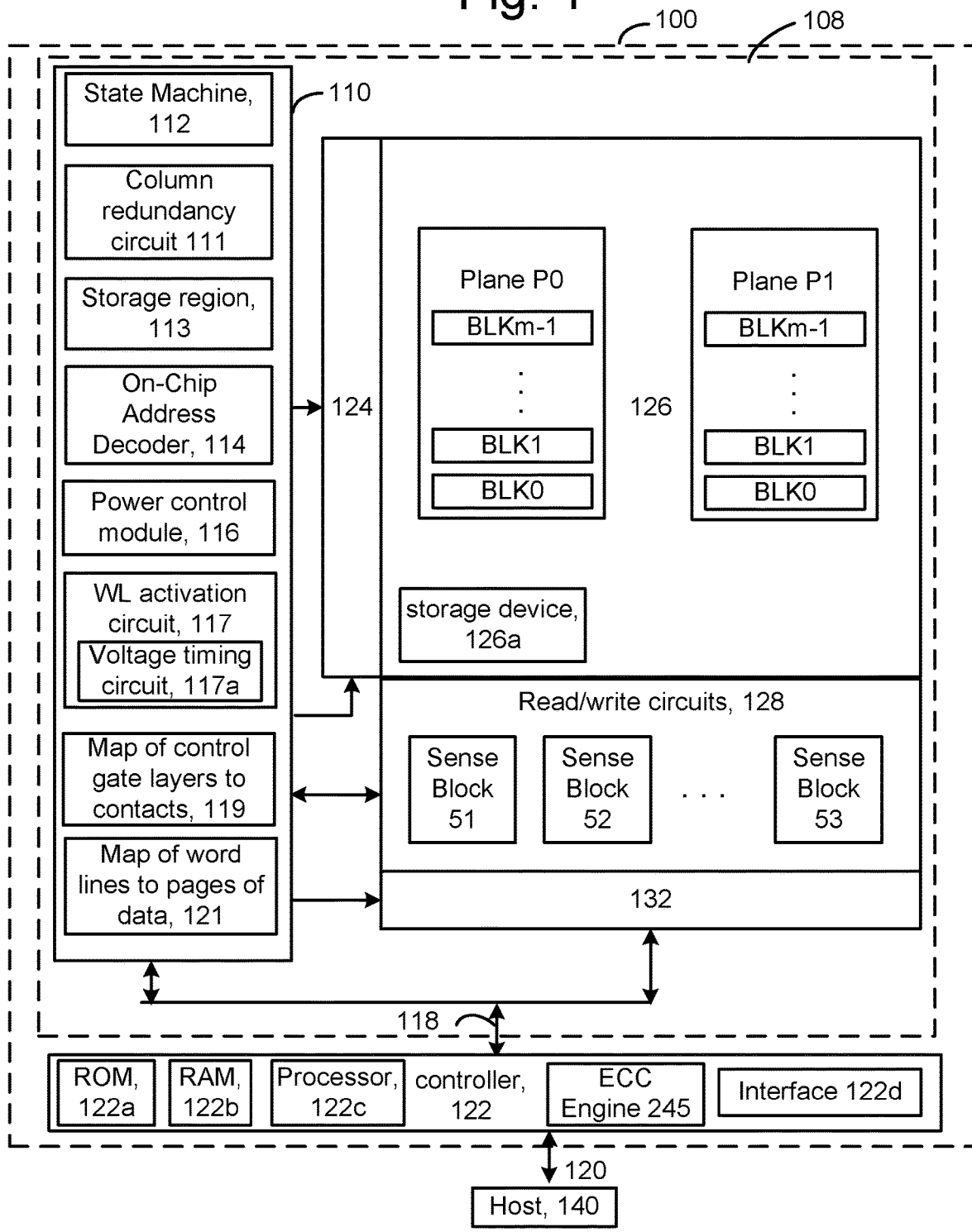
FIG. 1 is a block diagram of an example memory device.

Apparatuses and techniques are described for fast programming and read operations for memory cells.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10B. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, also referred to as SLC, or single level cell, there are two data states including the erased state and the programmed state. See FIG. 9A. MLC or multi-level cells store two or more bits per cell. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9B). In a four-bit per cell memory device, there are sixteen data states including the erased state (S0) and fifteen higher data states (S0-S15).

SLC programming is relatively fast and has high endurance, although the storage density (number of bits stored per memory cell) is lower than when multiple bits are stored in each memory cell. Regarding program speed, the SLC programming can be performed using only one program pulse in many cases. Read speed is also high because only one read voltage is needed and error correction can be simplified due to a wide margin between the two data states. Regarding endurance, data programmed by SLC programming can be read back accurately after many read cycles because there is a wider margin between the erased and programmed data states compared to MLC programming. SLC programming can therefore be used for applications in which program and read speed, and endurance, are of highest concern. For example, a set of SLC memory cells can be used as a cache between a CPU and a set of MLC memory cells. See also FIG. 16B-16D. An external controller can quickly program data to a block of SLC memory cells, and this data can be subsequently transferred to a block of MLC memory cells while the external controller performs another task. High endurance is important when the data is read many times in repeated read cycles, such as data stored in a server.

After the memory cells are programmed, the data can be read back in a read operation. A read operation can involve applying one read voltage, a series of read voltages, to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltages of adjacent data states. During the read operation, the voltages of the unselected word lines are ramped up to a read pass voltage which is high enough to place the unselected memory cells in a strongly conductive state, to avoid interfering with the sensing of the selected memory cells.

However, resistance-capacitance (RC) delays limit the ability to improve program and read speeds. For example, when applying a voltage signal to a word line, a certain amount of time is allocated to change a voltage based on the RC time constant of the word line. The RC time constant is a function of the word line dimensions and material. Additionally, a capacitance between word lines can further reduce performance.

Techniques provided herein address the above and other issues. In one aspect, a group of word lines comprising a selected word line and one or more adjacent word lines are driven with a common voltage signal during program and read operations. The memory cells of this group of word lines store common data, for each NAND string, and can be accessed for an operation such as programming or reading with a relatively high access speed. In one approach, the word lines in the group are permanently connected to one another by a conductive path, and a row decoder provides a voltage on one of the word lines which in turn is passed to the one or more adjacent word lines, so that the word lines are commonly driven. In another approach, the word lines in the group can be connected or disconnected by a switch, so that they can be driven independently or together. In another approach, the word lines in the group are not connected but are driven separately by common voltage signals. In another approach, the word lines in the group are not connected, and at least one word line is driven with a voltage kick which helps couple up an adjacent word line.

In another aspect, a short circuit between word lines is detected during a program operation and these word lines are treated as a connected group of word lines in future operations.

In one approach, one block of memory cells has a relatively high access speed and a relatively low storage density, while another block of memory cells has relatively low access speed and a relatively high storage density. In another approach, a portion of a block of memory cells (such as one or more connected groups of word lines) has a relatively high access speed and a relatively low storage density, while another portion of the block (such as one or more disconnected word lines) has a relatively low access speed and a relatively high storage density.

In one approach, one block comprises SLC memory cells, while another block comprises MLC memory cells. In another approach, one portion of a block comprise SLC memory cells while another portion of the block comprises MLC memory cells.

In another approach, the memory cells of a word line are divided into portions, and a portion which is closest to a row decoder is reserved for high access speed with a low storage density (e.g., SLC), while a remaining portion of the memory cells, further from the row decoder, are unused or reserved for low access speed with a high storage density (e.g., MLC).

These and other features are discussed further below.

FIG. 1 is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm−1 are arranged in each of planes P0 and P1. A plane may be an area of a substrate with a diffusion layer (such as the well region 433 in FIG. 3) which is common to each block in the plane, in one approach. The blocks in a plane typically share a common set of bit lines.

The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a column redundancy circuit 111, an on-chip address decoder 114, a power control module 116 (power control circuit), a word line activation circuit 117 (including a voltage timing circuit 117a), a map 119 of control gate layers (e.g., word lines and select gate lines) to contacts, where the contacts are connected to a row decoder to receive voltage signals, and a map 121 of word lines to pages of data. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The column redundancy circuit provides a mapping between spare NAND strings which replace defective primary NAND strings. The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The voltage timing circuit 117a can store data used in determining when to apply voltage signals. The data can indicate an amount of time to be allocated for a voltage signal to reach a steady state voltage during a voltage increase or decrease. As described further below, the amount of time which is allocated can vary based on an RC time constant of a word line. When a voltage signal is applied to two or more word lines connected together, the RC time constant is reduced compared to applying the voltage signal to a single word line, so that a reduced time period can be allocated for a voltage signal to reach a steady state voltage during a voltage increase or decrease. For example, the resistance is reduced by one half when two word lines are connected. Generally, the resistance is reduced by 1/N when N word lines are connected, where N≥2. The RC time constant is also therefore reduced by 1/N, so that the time allocated for changing a voltage on the connected word lines can be reduced. Based on the timing circuit, the word line activation circuit can control the row decoder to apply the desired voltage signals to the word lines at the desired times during a program or read operation. See FIGS. 20 and 21 for example voltage signals. The map 119 of control gate layers to contacts can be used to provide a cross-reference between control gate layers and contacts which lead to a row decoder. See FIGS. 12B, 13C and 14C. The map 121 of word lines to pages of data can be used to provide a cross-reference between word lines and pages of data which are written to, or read from, the word lines. See FIGS. 12C, 13D and 14D. The word line activation circuit 117 can be used to control the row decoder to provide voltage signals to the word lines.

The word line activation circuit 117, the voltage timing circuit 117a and the maps 119 and 121 may be configured with hardware, firmware and/or software for performing the techniques described herein including the processes of the flowcharts described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the processes described herein, including the processes of the flowcharts of FIG. 11A-11K.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
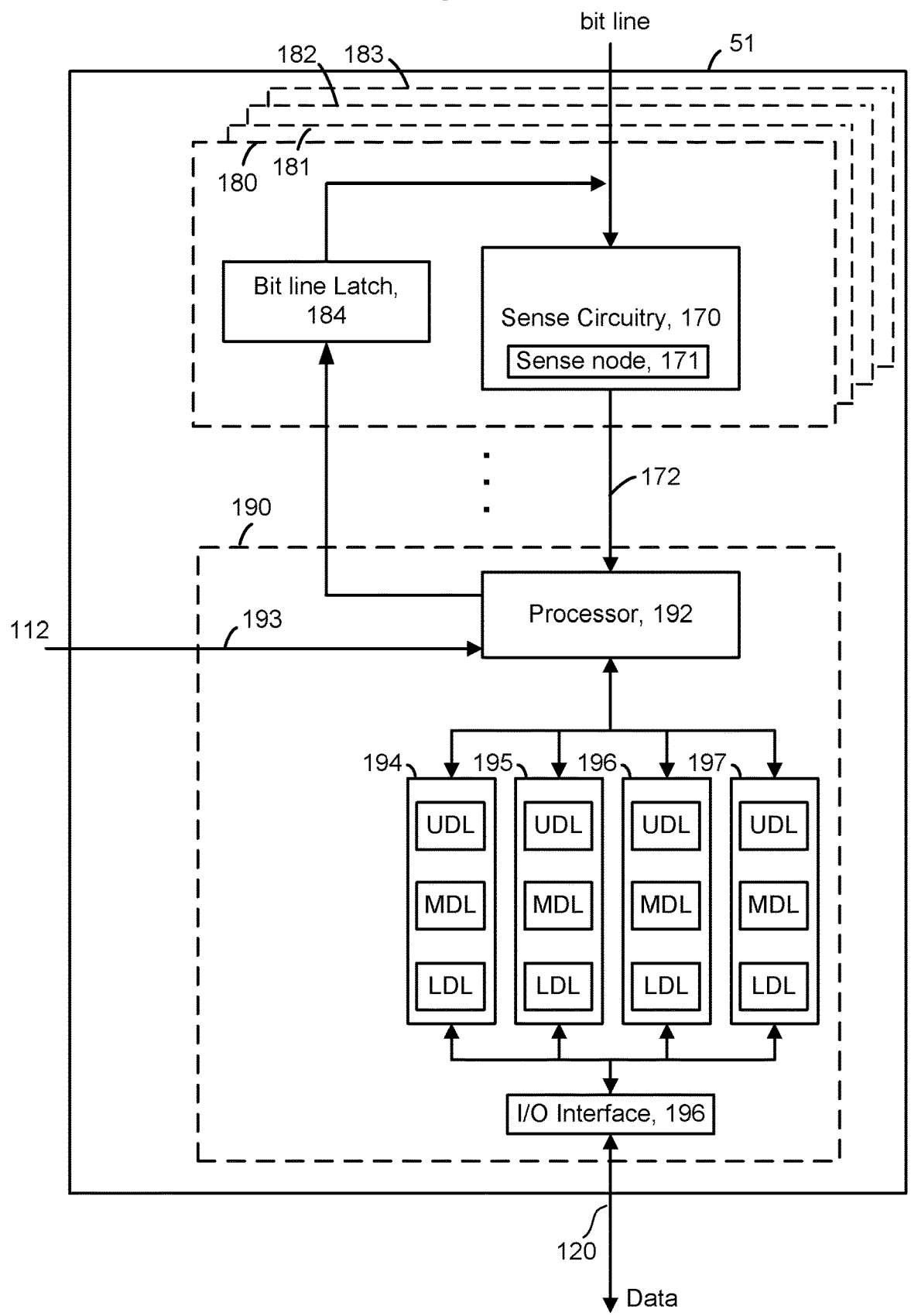
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

Figure 21:
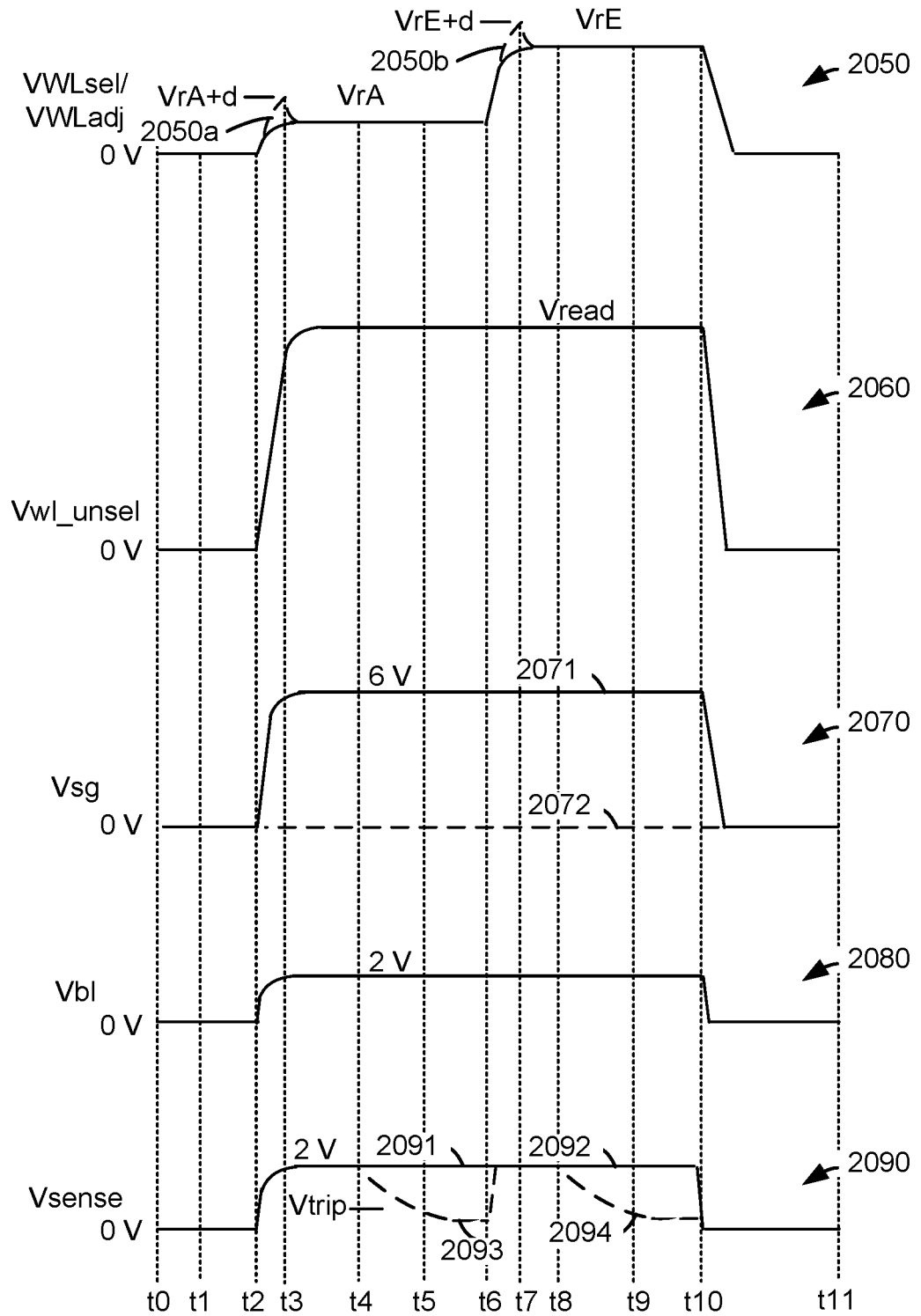
FIG. 21 depicts examples of voltage signals which can be used in a read operation, consistent with FIG. 11G.

The sense circuit 180, as an example, comprises sense circuitry 170 that performs sensing by determining whether a conduction current in a connected bit line is above or below a predetermined threshold level. The sense circuitry may include a sense node 171 which is charged up during sensing. An amount of decay of the sense node is used to determine whether a memory cell is in a conductive or non-conductive state. See also FIG. 21, plot 2090. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per storage element implementation.

The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify voltage. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. a MDL or UDL latch is flipped when a middle or upper page bit, respectively, is stored in an associated storage element. This occurs when an associated storage element completes programming, e.g., when its Vth exceeds a target verify voltage such as VvA-VvG (see FIG. 9B).

Figure 3:
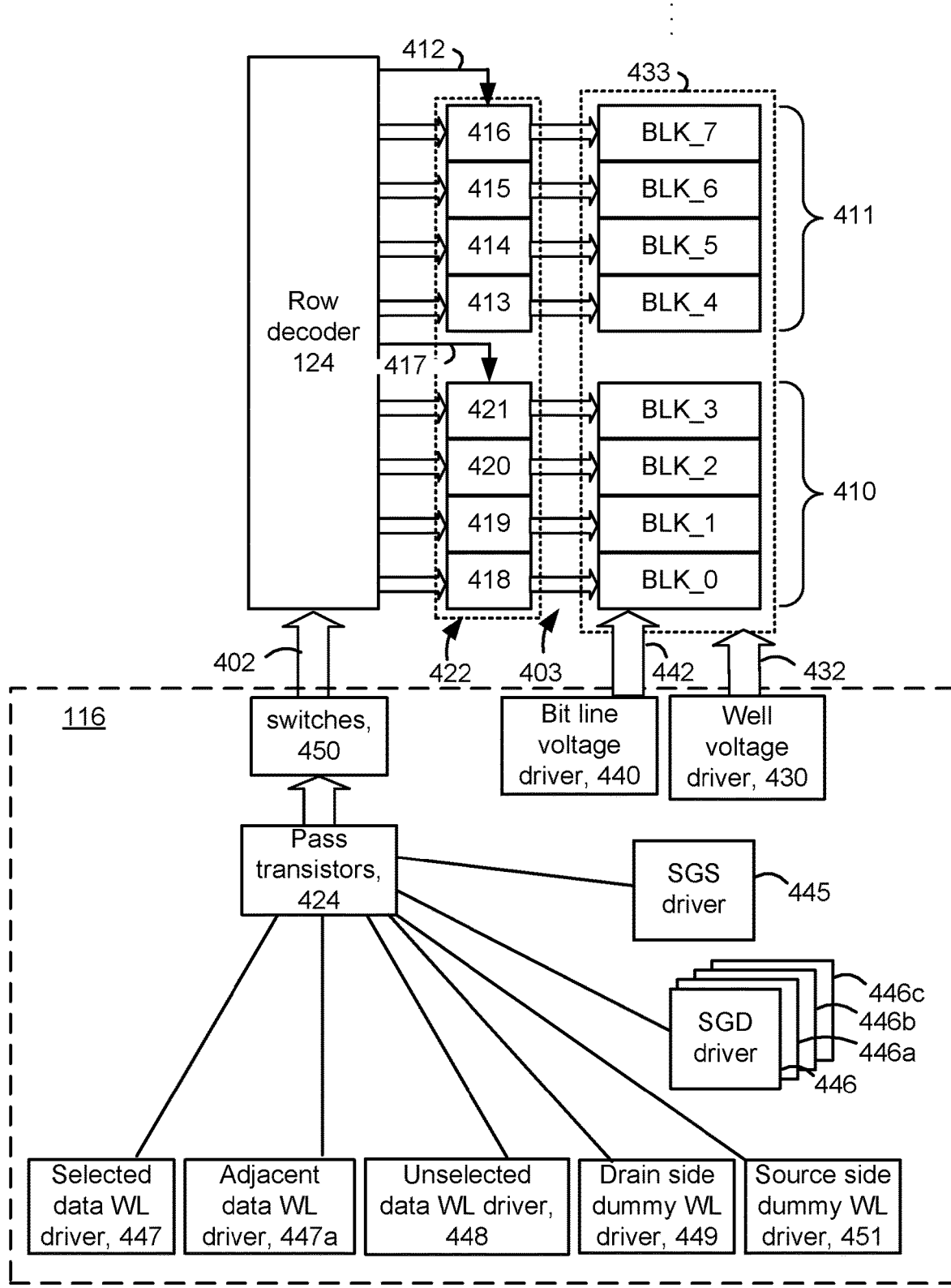
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include an adjacent data word line driver 447a which provides a voltage on a data word line which is adjacent to the selected word line. The adjacent data word line driver can also provide a voltage on data word lines which are adjacent to the selected word line on both sides of the selected word line. The voltage drivers can also include a driver 448 for unselected data word lines. These can be remaining, unselected word lines other than the selected word line and the one or more adjacent word lines. The voltage drivers can also include a drain-side dummy word line driver 449 which provides voltages on drain-side dummy word lines such as WLDD0 and WLDD1, and a source-side dummy word line driver 451 which provides voltages on source-side dummy word lines such as WLDS1 and WLDS0. See FIG. 5A.

The voltage drivers can also include separate SGD drivers for each sub-block in a block. For example, SGD drivers 446, 446a, 446b and 446c can be provided for SB0, SB1, SB2 and SB3, respectively, of BLK0 such as in FIG. 6-8. In one option, one SGS driver 445 is common to the different sub-blocks in a block. In another option, separate SGS drivers are provided for each sub-block of a block. Moreover, in some cases, such as a depicted in FIGS. 6 and 8, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven, as in FIGS. 12A, 13A and 14A.

The various components, including the row decoder, may receive commands from a controller such as the state machine 112 or the controller 122 to perform the functions described herein.

In one approach, the well region 433 (see also FIG. 5A) is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 4:
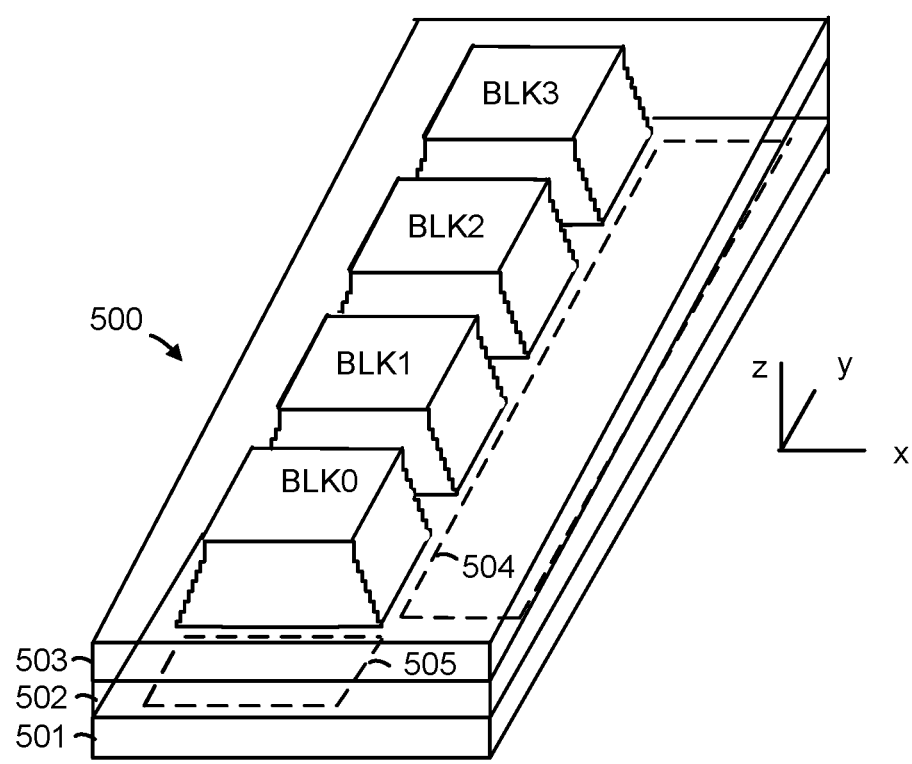
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5C:
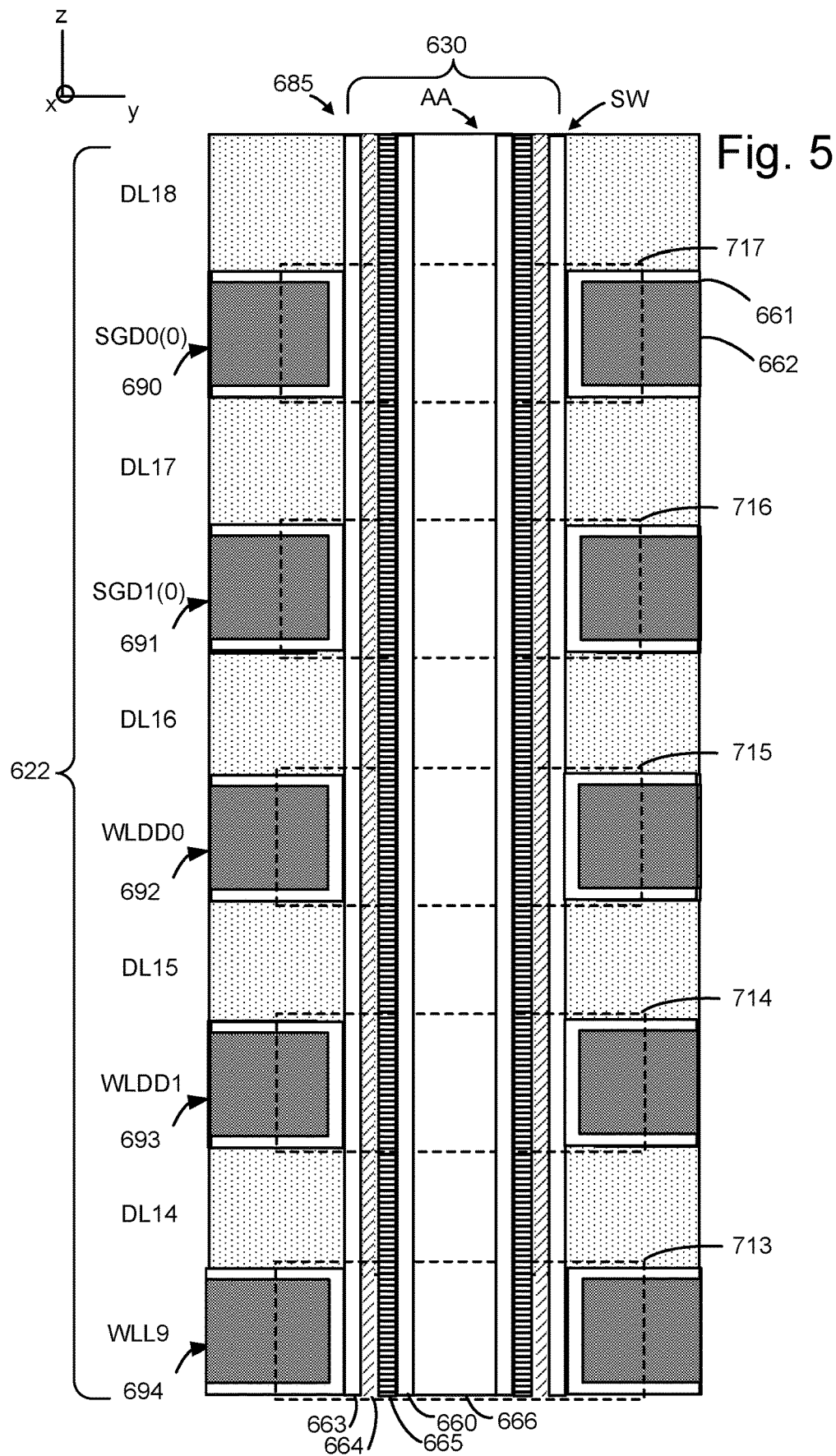
FIG. 5C depicts a close-up view of the region 622 of the stack of FIG. 5A.

FIG. 5A depicts an example cross-sectional view of a portion of BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and ten data word line layers (or data word lines) WLL0-WLL9. WLL0 is a source side data word line and WLDS1 is a dummy word line layer which is adjacent to the source side data word line. WLDS0 is another dummy word line layer which is adjacent to WLDS1. WLL9 is a drain side data word line and WLDD1 is a dummy word line layer which is adjacent to the drain side data word line. WLDD0 is another dummy word line layer which is adjacent to WLDD1. The dielectric layers are labelled as DL1-DL18. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 5C.

The stack includes a substrate 611. In one approach, a portion of the source line SL comprises a well region 433 (see also FIG. 3) as an n-type source diffusion layer or well in the substrate. The well region is in contact with a source end of each string of memory cells in a block. An erase pulse may be applied to this layer in an erase operation. The n-type well region 433 is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 5B depicts an example transistor 650. The transistor comprises a control gate CG, a drain D, a source S and a channel CH and may represent a memory cell or a select gate transistor, for example.

FIG. 5C depicts a close-up view of the region 622 of the stack of FIG. 5A. Memory cells are formed at the different levels of the stack at the intersection of a word line layer and a memory hole. In this example, SGD transistors 717 and 716 are provided above dummy memory cells 715 and 714 and a data memory cell 713. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 716 and 717. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6:
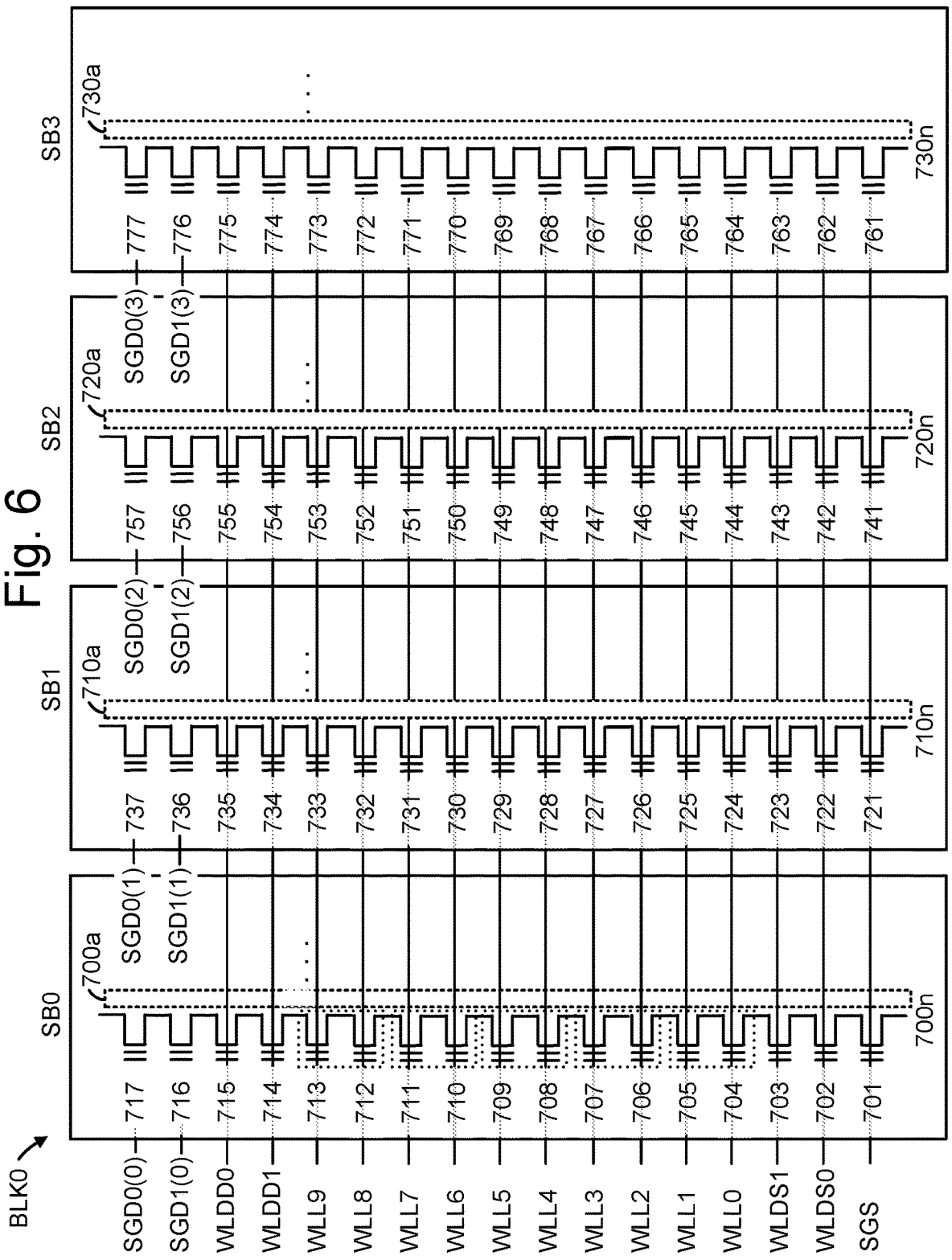
FIG. 6 depicts an example view of NAND strings in BLK0 which is consistent with FIGS. 4 and 5A.

FIG. 6 depicts an example view of NAND strings in BLK0 which is consistent with FIGS. 4 and 5A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line portion at a time, before programming the memory cells of the next sub-block. The word line programming order may start at WL0, the source-end word line and end at WLL9, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704-713, dummy memory cells 714 and 715, and SGD transistors 716 and 717. NAND string 710n includes SGS transistor 721, dummy memory cells 722 and 723, data memory cells 724-733, dummy memory cells 734 and 735, and SGD transistors 736 and 737. NAND string 720n includes SGS transistor 741, dummy memory cells 742 and 743, data memory cells 744-753, dummy memory cells 754 and 755, and SGD transistors 756 and 757. NAND string 730n includes SGS transistor 761, dummy memory cells 762 and 763, data memory cells 764-773, dummy memory cells 774 and 775, and SGD transistors 776 and 777.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

Figure 7:
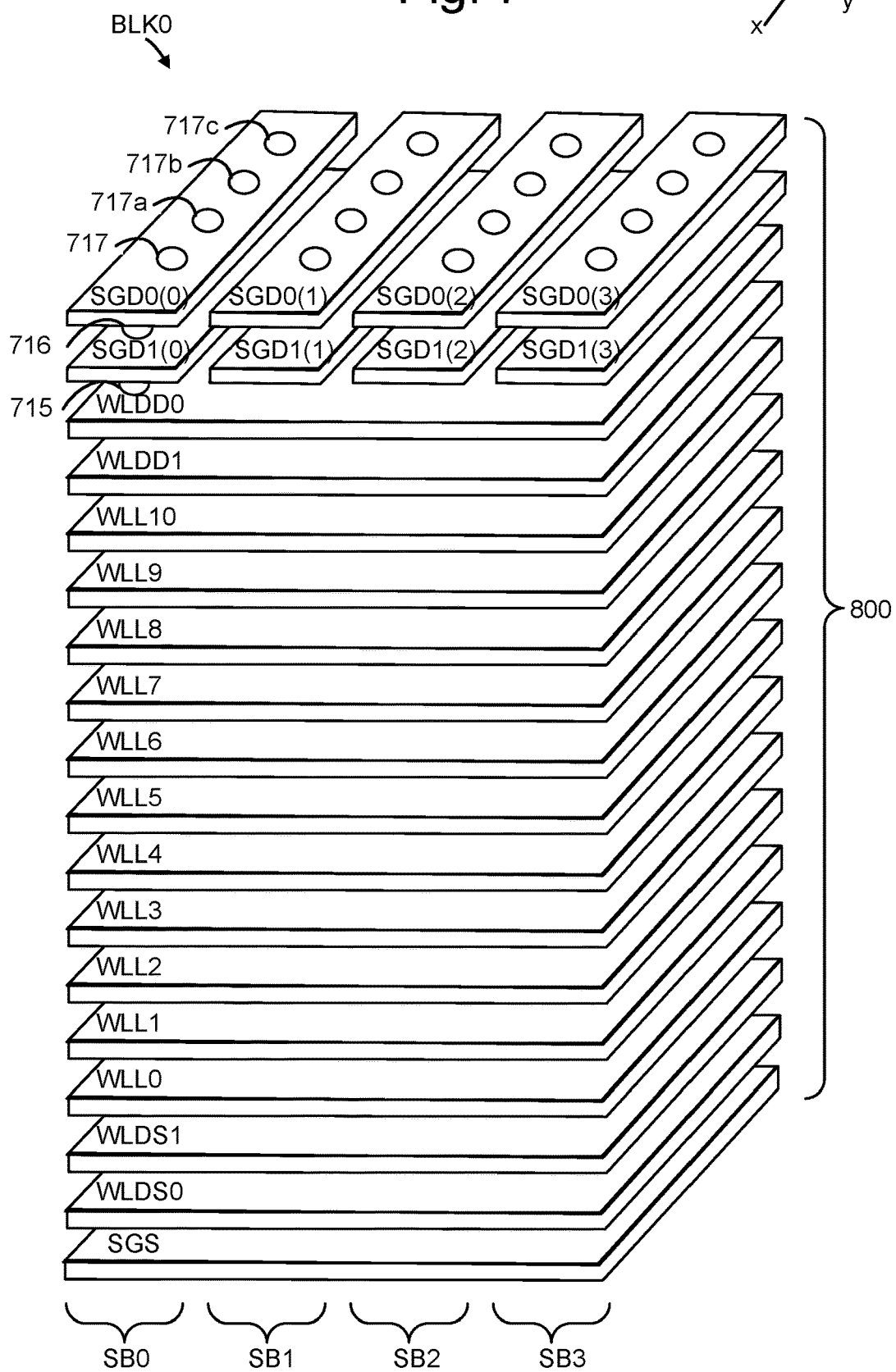
FIG. 7 depicts control gate layers in BLK0 consistent with FIG. 6.

FIG. 7 depicts control gate layers in BLK0 consistent with FIG. 6. The control gate layers are arranged in a stack 800 and include dummy word lines layers or control gate layers WLDS0, WLDS1, WLDD0 and WLDD1, and data word line layers or control gate layers WLL0-WLL9, which are shared among the different sub-blocks SB0-SB3. The control gate layers include a common SGS control gate layer for the block. Optionally, a separate SGS control gate layer could be provided for each sub-block. For example, SB0, SB1, SB2 and SB3 include SGD0(0) and SGD1(0), SGD0(1) and SGD1(1), SGD0(2) and SGD1(2), and SB3 SGD0(3) and SGD1(3), respectively. Additionally, four example memory holes are depicted in each sub-block. SGD transistors 717, 717a, 717b and 717c are depicted in SGD0(0), SGD transistor 716 is depicted in SGD1(0) and a dummy memory cell 715 is depicted in WLDD0.

Figure 8:
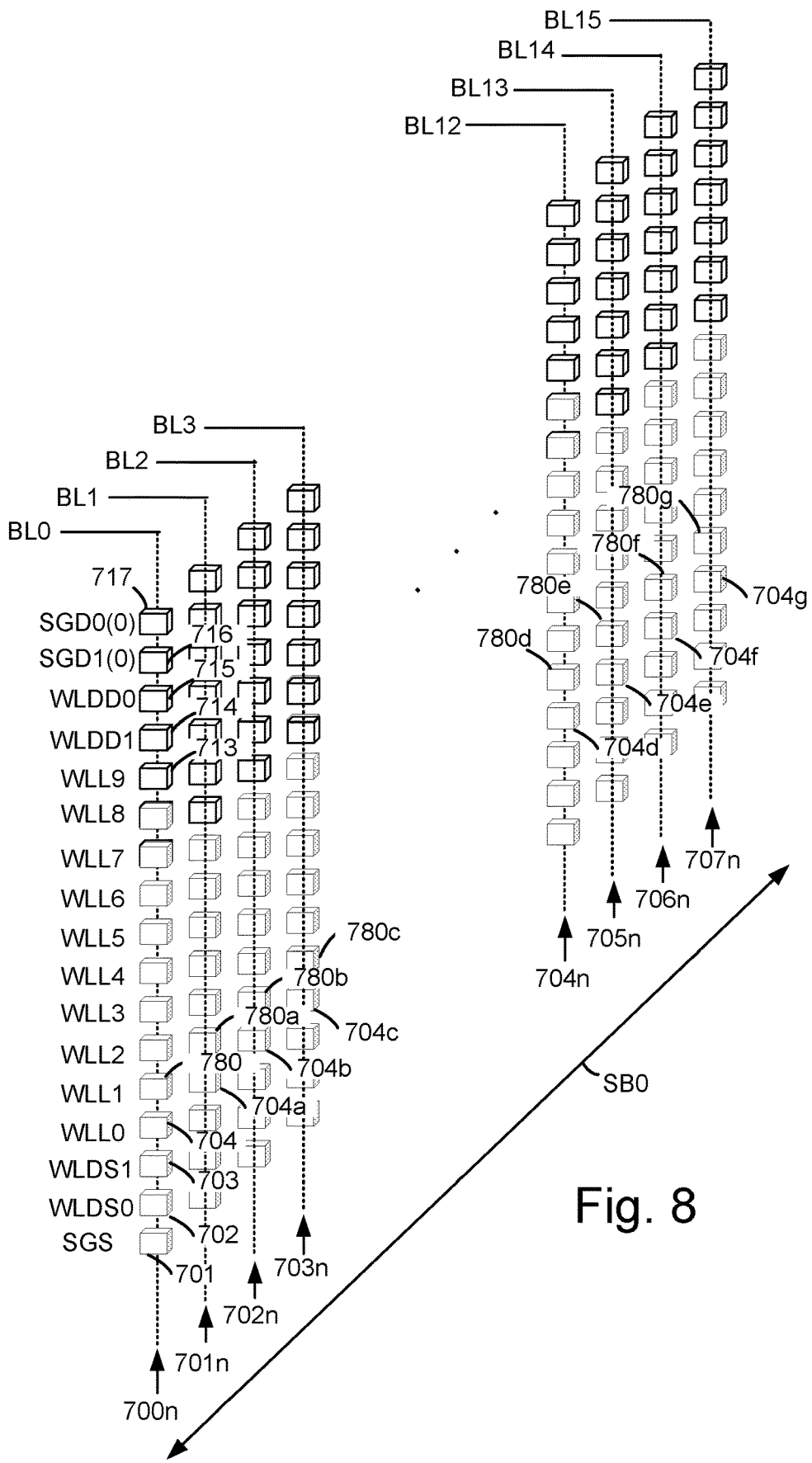
FIG. 8 depicts additional detail of SB0 of FIGS. 6 and 7.

FIG. 8 depicts additional detail of SB0 of FIGS. 6 and 7. The NAND string 700n of FIG. 6 is depicted along with additional NAND strings 701n-707n which are also in SB0. Each memory cell is depicted as a cube for simplicity. A bit line is connected to each respective NAND string. In this example, there are sixteen NAND strings connected to bit lines BL0-BL15. For example, BL0-BL3 are connected to NAND strings 700n-703n, respectively, and BL12-BL15 are connected to NAND strings 704n-707n, respectively. Sense circuits may be connected to each bit line. For example, the sense circuits 180-183 of FIG. 2 may be connected to bit lines BL0-BL3, respectively.

A set of memory cells is connected to each word line. For example a set of memory cells 704-704g is connected to WLL0 in NAND strings 700n-707n, respectively, and a set of memory cells 780-780g is connected to WLL1 in NAND strings 700n-707n, respectively. Further, in each NAND string, the memory cells of WLL0 and WLL1 are adjacent to one another and may be programmed to a common data state or sensed as being in a common data state, when WLL0 and WLL1 are driven by a common voltage signal as described herein.

During a program operation, some of the NAND strings in a sub-block may be selected for programming when the associated latches have a program status, and other NAND strings in the sub-block may be unselected for programming when the associated latches have a lockout status.

Figure 9A:
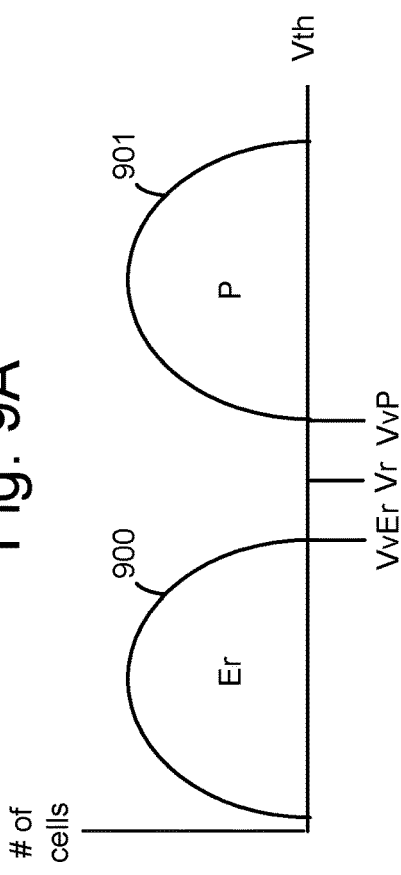
FIG. 9A depicts threshold voltage (Vth) distributions 900 and 901 of SLC memory cells in an erased (Er) state and a programmed (P) state, respectively.
Figure 9B:
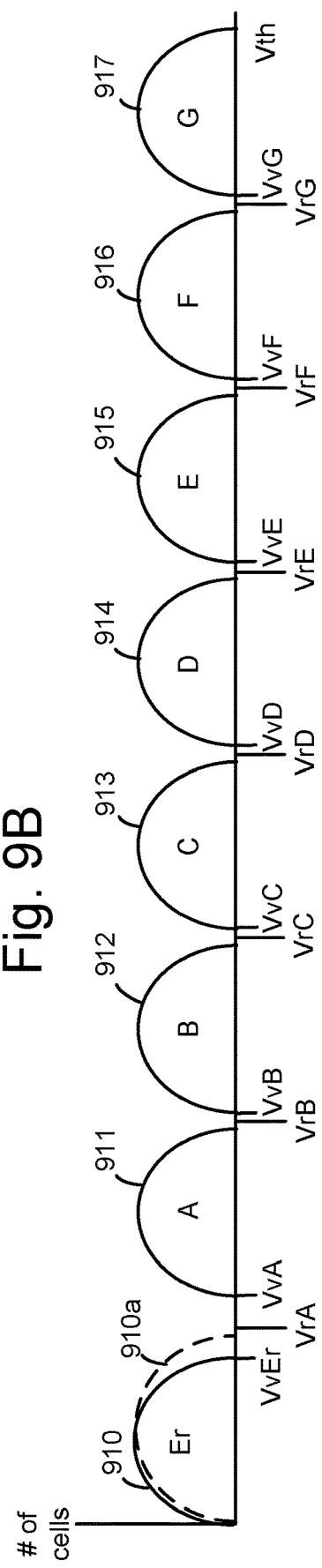
FIG. 9B depicts an example Vth distribution of a set of MLC memory cells in eight data states.

FIG. 9A depicts threshold voltage (Vth) distributions 900 and 901 of SLC memory cells in an erased (Er) state and a programmed (P) state, respectively. In FIGS. 9A and 9B, the vertical axis depicts a number of memory cells on a logarithmic scale and the horizontal axis depicts the Vth on a linear scale. Initially, a block of memory cells is erased and the memory cells are in the Er state. The erase operation may use the erase-verify voltage VvEr to provide the Vth distribution 900. Subsequently, when a program operation is performed, some of the memory cells remain in the Er state while others are programmed to the P state in one or more program loops. The program operation may use the program-verify voltage VvP to provide the Vth distribution 901.

In this example, the memory cells are SLC memory cells which are programmed in one or two program loops, e.g., using one or two program voltages or pulses such as by using the voltage signal of FIG. 10A. For example, assume the Vth distribution 901 is obtained after one program pulse. A verify test may be performed after the first program pulse to ensure that Vth>VvP; otherwise, a second program pulse can be applied. The SLC memory cells thus can be programmed very quickly, compared to MLC memory cells which are programmed using several program pulses.

FIG. 9B depicts an example Vth distribution of a set of MLC memory cells in eight data states. In one approach, at a start of a program operation, the memory cells are all initially in the erased state as represented by the Vth distribution 910. After the program operation is successfully completed, the memory cells assigned to the Er state are represented by the Vth distribution 910a, where the Vth distribution is upshifted due to program disturb.

The memory cells which are programmed to the A, B, C, D, E, F and G states using verify voltages of VvA, VvB, VvC, VvD, VvE, VvF and VvG, respectively, are represented by the Vth distributions 911, 912, 913, 914, 915, 916 and 917, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr.

FIG. 10A depicts a voltage signal used in a series of program loops in an example program operation for SLC memory cells which results in the Vth distribution of FIG. 9A. As mentioned, SLC programming can be relatively fast since it involves one or sometimes two program pulses, in one approach. In FIGS. 10A and 10B, the horizontal axis denotes a program loop number, and the vertical axis denotes voltage. The voltage signal 1050 includes a program pulse 1051 and program-verify voltage VvP 1052 in a first program loop, and a program pulse 1053 and program-verify voltage VvP 1054 in a second and final program loop. The voltage signal is applied to a word line which is selected for programming. The initial program voltage and the step size can be different for the SLC programming of FIG. 10A compared to the MLC programming of FIG. 10B.

FIG. 10B depicts a voltage signal used in a series of program loops in an example program operation for MLC memory cells which results in the Vth distribution of FIG. 9B. During a program operation, program loops are performed for a selected word line in a selected block. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1000 includes a series of program voltages, including an initial program voltage 1001, which are applied to a word line selected for programming In this example, the voltage signal includes program voltages which increase stepwise in amplitude in one or more program loops of a programming pass using a fixed or varying step size. This is referred to as incremental step pulse programming, where the program voltage starts at an initial voltage (see program voltage 1001) and increases in a step in each successive program loop, for instance, until the program operation is completed. The operation is successfully completed when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1002, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. See also the verify phase of FIG. 20.

All memory cells may initially be in the erased state at the beginning of the program operation, for instance. After the program operation is completed, the data can be read from the memory cells using read voltages which are between the Vth distributions. At the same time, a read pass voltage, Vread (e.g., 8-10 V), also referred to as pass voltage or turn-on voltage, is applied to the remaining (unselected) word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. See also FIG. 21. The data of the middle page can be determined by reading the memory cells using read voltages of VrB, VrD and VrF. The data of the upper page can be determined by reading the memory cells using read voltages of VrC and VrG.

Figure 11A:
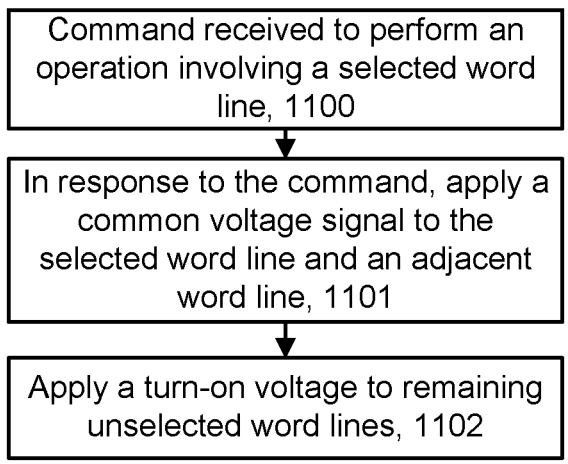
FIG. 11A depicts an example process for providing a common voltage signal to a selected word line and an adjacent word line.

FIG. 11A depicts an example process for providing a common voltage signal to a selected word line and an adjacent word line. As mentioned at the outset, faster access times in program and read operations can be achieved by applying a common voltage signal to a group of two or more adjacent word lines. See FIGS. 20 and 21 for examples of voltage signals. A voltage signal may refer to, e.g., a single voltage, or to a series of voltages including transitions between voltages. One of the word lines can be referred to as a selected word line while another word line is an adjacent word line. The word lines can also be referred to as a group of two or more adjacent word lines. When a common voltage signal is applied to the selected word line and the adjacent word line in a program operation, the same data is programmed into the memory cells of these word lines. That is, in each NAND string, a memory cell which is connected to the selected word line will be programmed to the same data state as a memory cell which is connected to the adjacent word line. While this reduces the data storage density, access time is improved. Similarly, when a common voltage signal is applied to the selected word line and the adjacent word line in a read operation, the same data is read from the memory cells of these word lines. Optionally, in a read operation, data can be read from the selected word line but not the adjacent word line if the word lines are not connected. To achieve this, the read voltage is applied to the selected word line while Vread is applied to the unselected word line.

In one approach, in a group of adjacent word lines, a command is received to perform an operation involving the selected word line (step 1100). For example, a command to perform a program or read operation may identify the selected word line by an address. It is possible for a command to identify the selected word line and the adjacent word line, but a command protocol which identifies a single word line—the selected word line—can be simpler. The command may be received at the controller 122 from the host, or at the control circuitry 110 from the controller 122, for example. At step 1101, in response to the command, a common voltage signal is applied to the selected word line and the adjacent word line.

At step 1102, a turn-on voltage (a second voltage signal) is applied to the remaining unselected word lines. This can include the data word lines other than the selected word line and one or more adjacent word lines of steps 1100 and 1101.

A common voltage signal can be applied to the selected word line and the adjacent word line in different ways. In one approach, separate selectors of a row decoder (see FIG. 15A) pass the common voltage signal separately to these word lines, and these word lines are not electrically connected to one another by a conductive path. This approach results in a reduced RC time constant and is thus helps achieve a faster voltage ramp up time. Tests have advantageously shown that programming adjacent memory cells on a NAND string to a common data state can result in narrower Vth distributions, compared to programming the adjacent memory cells separately. In another approach, a single selector of a row decoder passes the common voltage signal to the selected word line and the voltage is passed to the adjacent word line via a conductive path between the selected word line and the adjacent word line. The conductive path can be permanent as in the case of a fixed conductive material between the word lines (see the contacts in FIGS. 15B and 15C), or switchable (non-permanent) as in the case of a switched conductive path (see the switches 1531a and 1532a in FIG. 15D). This approach results in a reduced RC time constant and therefore a shorter voltage ramp up period. See FIG. 18.

In one approach, the command of step 1100 comprises a program command, and the selected word line and the adjacent word line comprise adjacent memory cells in a NAND string which are programmed to a common data state. For example, in the sub-block of FIG. 8, assume WLL0 is a selected word line and WLL1 is the adjacent word line. Therefore, the memory cells 704-704g are adjacent memory cells of the memory cells 780-780g, respectively, of WLL1 in the NAND strings 700n-707n, respectively, and are programmed to a common data state. This could be the programmed (P) state for SLC memory cells, for example (FIG. 9A). In another approach, the command of step 1100 comprises a sensing command, such as a read or verify command, and the selected word line and the respective adjacent word line comprise adjacent memory cells in a NAND string which are sensed as being in a common data state. In one approach, data is stored redundantly in N adjacent SLC memory cells on a NAND string, where N≥2, so that the storage density is 1/N bits per memory cell.

Figure 11C:
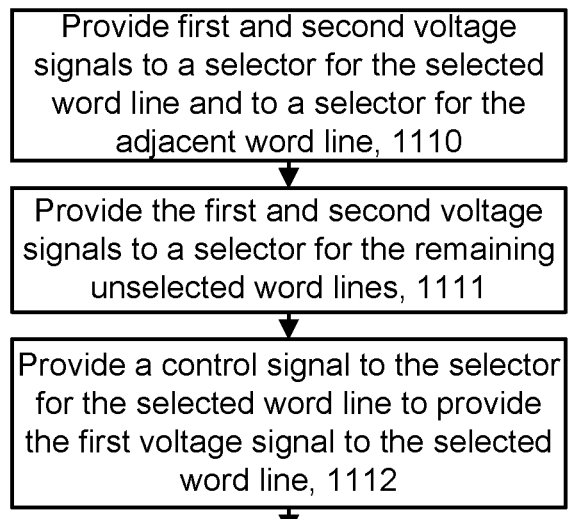
FIG. 11C depicts an example implementation of the process of FIG. 11A in which a first voltage signal is passed to a selected word line and an adjacent word line via respective selectors.
Figure 11B:
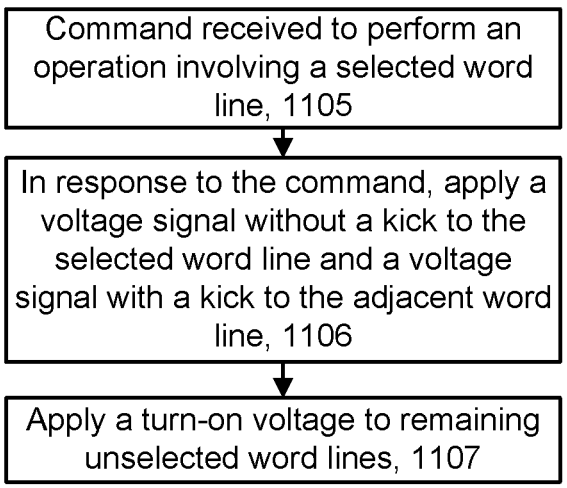
FIG. 11B depicts an example process for providing a voltage signal without a kick to a selected word line and a voltage signal with a kick to an adjacent word line.
Figure 20:
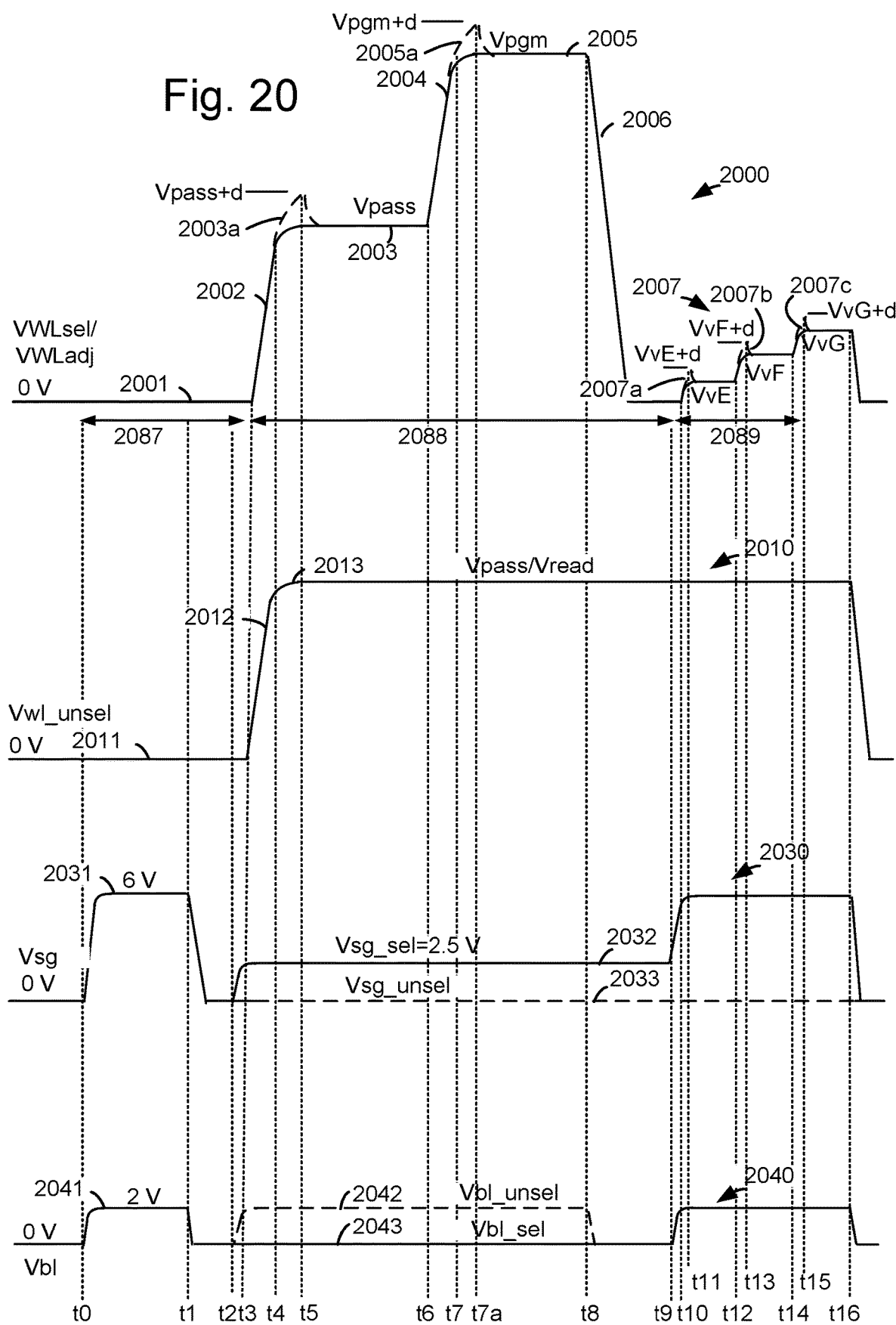
FIG. 20 depicts examples of voltage signals which can be used in a program loop of a program operation, consistent with FIG. 11F.

FIG. 11B depicts an example process for providing a voltage signal without a kick to a selected word line and a voltage signal with a kick to an adjacent word line. FIGS. 20 and 21 provide examples of voltage signals with and without kicks. A voltage signal with a kick refers to, e.g., a voltage signal which is increased from a starting voltage to a peak voltage temporarily and then decreased slightly to a final voltage. A requested output of a voltage driver is set to the peak voltage and then to the final voltage to cause the voltage to increase from the starting voltage to the final voltage more quickly than if the requested output of the voltage driver changed directly from the starting voltage to the final voltage. The peak voltage could be, e.g., up to 10-30% higher than the final voltage. The voltage signal has an overshoot above the desired final voltage.

In one embodiment, the voltages of the selected word line and its one or more adjacent word lines are increased, such as during a program or read operation. In the program phase of a program operation, an increase could be from an initial voltage such as 0 V to an intermediate voltage such as Vpass, or from the intermediate voltage to a program voltage of Vpgm. See FIG. 20. In the verify phase of a program operation, an increase could be from an initial voltage such as 0 V to an initial verify voltage such as VvE, or from one verify voltage to a higher verify voltage, e.g., from VvE to VvF or from VvF to VvG in FIG. 20. In a read operation, an increase could be from an initial voltage such as 0 V to an initial read voltage such as VrA, or from one read voltage to a higher read voltage, e.g., from VrA to VrE in FIG. 21.

The voltage kick on the adjacent word line provides an increased level of capacitive coupling to the selected word line, so that voltage on the selected word line can be increased more quickly than when the voltage kick is not used. See FIGS. 17A, 17B and 18. A further option is to provide a voltage kick on the selected word line as well. The voltage kick on the adjacent word line can be greater than on the selected word line, in one approach.

At step 1105, a command is received to perform an operation involving a selected word line. At step 1106, in response to the command, a voltage signal without a kick is applied to the selected word line, and a voltage signal with a kick is applied to the adjacent word line. At step 1107, a turn-on voltage is applied to the remaining unselected word lines.

FIG. 11C depicts an example implementation of the process of FIG. 11A in which a first voltage signal is passed to a selected word line and an adjacent word line via respective selectors. In this example, the selected word line and the adjacent word line may have their own selectors and be disconnected from one another. See FIG. 15A, for example, where each word line has a respective selector 1500-1509 which can pass a voltage signal VWLunsel, VWLsel or WLadj from a voltage driver 1550, 1560 or 1570, respectively, to the word line. Further, assume WLL2 is the selected word line and WLL1 and WLL3 are adjacent word lines. The remaining unselected word lines are WLL0 and WLL4-WLL9.

Step 1110 includes providing first and second voltage signals (e.g., VWLsel and VWLunsel, respectively) to a selector 1502 for the selected word line and to a selector 1501, 1503 for the adjacent word line. Step 1111 includes providing the first and second voltage signals to a selector 1500, 1504-1509 for the remaining unselected word lines. Step 1112 includes providing a control signal (CTRL) to the selector for the selected word line to provide the first voltage signal to the selected word line. Step 1113 includes providing a control signal (CTRL) to the selector for the adjacent word line to provide the first voltage signal to the adjacent word line. Step 1114 includes providing a control signal to the selectors for the remaining unselected word lines to provide the second voltage signal to the remaining unselected word lines. Thus, VWLsel is provided to WLL1-WLL3 and VWLunsel is provided to WLL1 and WLL4-WLL9, in this example. In another example, just one of the adjacent word lines WLL1 or WLL3 receives VWLsel and the other adjacent word line is included with the remaining unselected word lines.

Figure 11D:
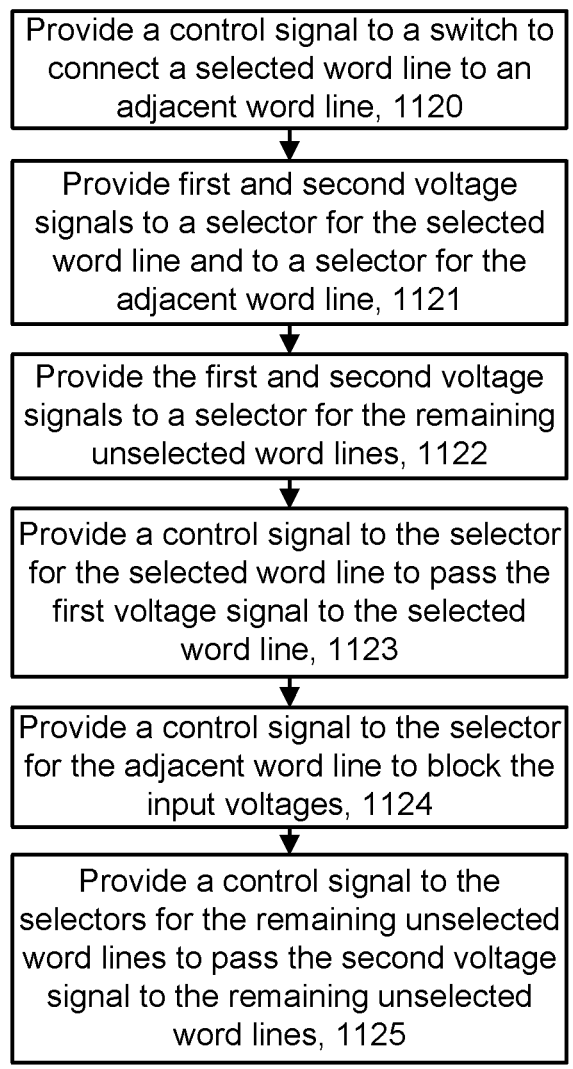
FIG. 11D depicts an example implementation of the process of FIG. 11A in which a first voltage signal is passed to a selected word line and an adjacent word line via a respective selector of the selected word line, and the selected word line is connected to the adjacent word line via a switch.

FIG. 11D depicts an example implementation of the process of FIG. 11A in which a first voltage signal is passed to a selected word line and an adjacent word line via a respective selector (e.g., 1502) of the selected word line, and the selected word line is connected to the adjacent word line via a switch. For example, see FIG. 15D and the switches 1531a and 1532a in the switched paths 1531 and 1532, respectively. The switched path 1531 can connect WLL0 with WLL1, and the switched path 1532 can connect WLL2 and WLL3. Further, the switches 1531a and 1532a may be controlled by control signals EN1 and EN2, respectively. For example, the switches may be nMOSFETs which are made conductive to close the respective switched path when the enable signal is high, or made non-conductive to open the switched path when the enable signal is low.

Step 1120 includes providing a control signal (EN1, EN2) to a switch to connect a selected word line to an adjacent word line. Assume WLL2 and WLL3 are the selected and adjacent word lines, respectively. Step 1121 includes providing first and second voltage signals (e.g., VWLsel and VWLunsel, respectively) to a selector (e.g., 1502) for the selected word line and to a selector (e.g., 1503) for the adjacent word line. Step 1122 includes providing the first and second voltage signals to a selector (e.g., 1500, 1501, 1503-1509) for the remaining unselected word lines. Step 1123 includes providing a control signal to the selector for the selected word line to pass the first voltage signal to the selected word line. Step 1124 includes providing a control signal to the selector for the adjacent word line to block the input voltages. Since the input voltages are block for the adjacent word line, and the switch is closed (conductive), the adjacent word line is driven by the voltage (VWLsel) provided to the selected word line on the path 1523. Step 1125 includes providing a control signal to the selectors for the remaining unselected word lines to pass the second voltage signal to the remaining unselected word lines.

Figure 11E:
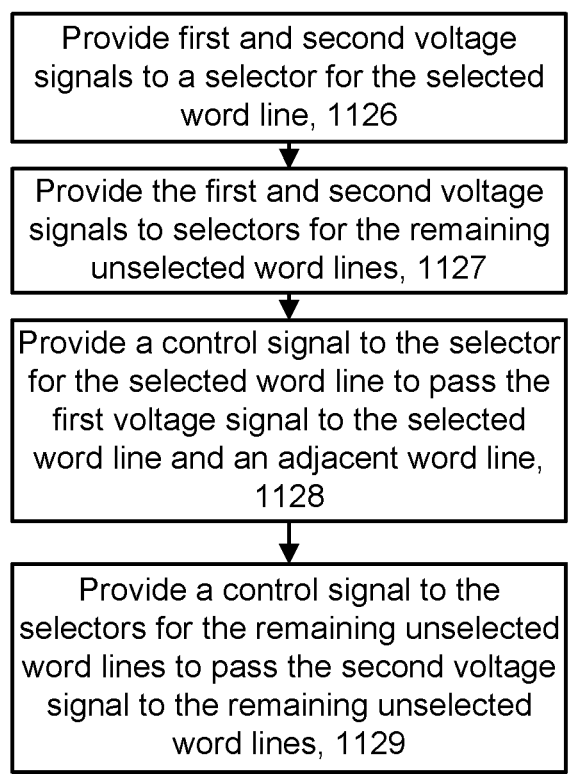
FIG. 11E depicts an example implementation of the process of FIG. 11A in which a first voltage signal is passed to a selected word line and an adjacent word line via a respective selector of the selected word line, and the selected word line is permanently connected to the adjacent word line.

FIG. 11E depicts an example implementation of the process of FIG. 11A in which a first voltage signal is passed to a selected word line and an adjacent word line via a respective selector of the selected word line, and the selected word line is permanently (non-switchably) connected to the adjacent word line. For example, see FIG. 15B, where WLL0 and WLL1, WLL2 and WLL3, WLL4 and WLL5, WLL6 and WLL7, and WLL8 and WLL9 are permanently connected. See also FIG. 15C, where WLL0 and WLL1, and WLL2 and WLL3, are permanently connected. Step 1126 includes providing first and second voltage signals (e.g., VWLsel and VWLunsel, respectively) to a selector for the selected word line. For example, with WLL2 as the selected word line, the selector 1502 is used. Step 1127 includes providing the first and second voltage signals to selectors for the remaining unselected word lines. For example, this could include the selectors 1500, 1504, 1506 and 1508 in FIG. 15B. Step 1128 includes providing a control signal to the selector for the selected word line to pass the first voltage signal to the selected word line and an adjacent word line, e.g., WLL2 and WLL3, respectively. Step 1129 includes providing a control signal to the selectors for the remaining unselected word lines to pass the second voltage signal to the remaining unselected word lines.

Figure 11F:
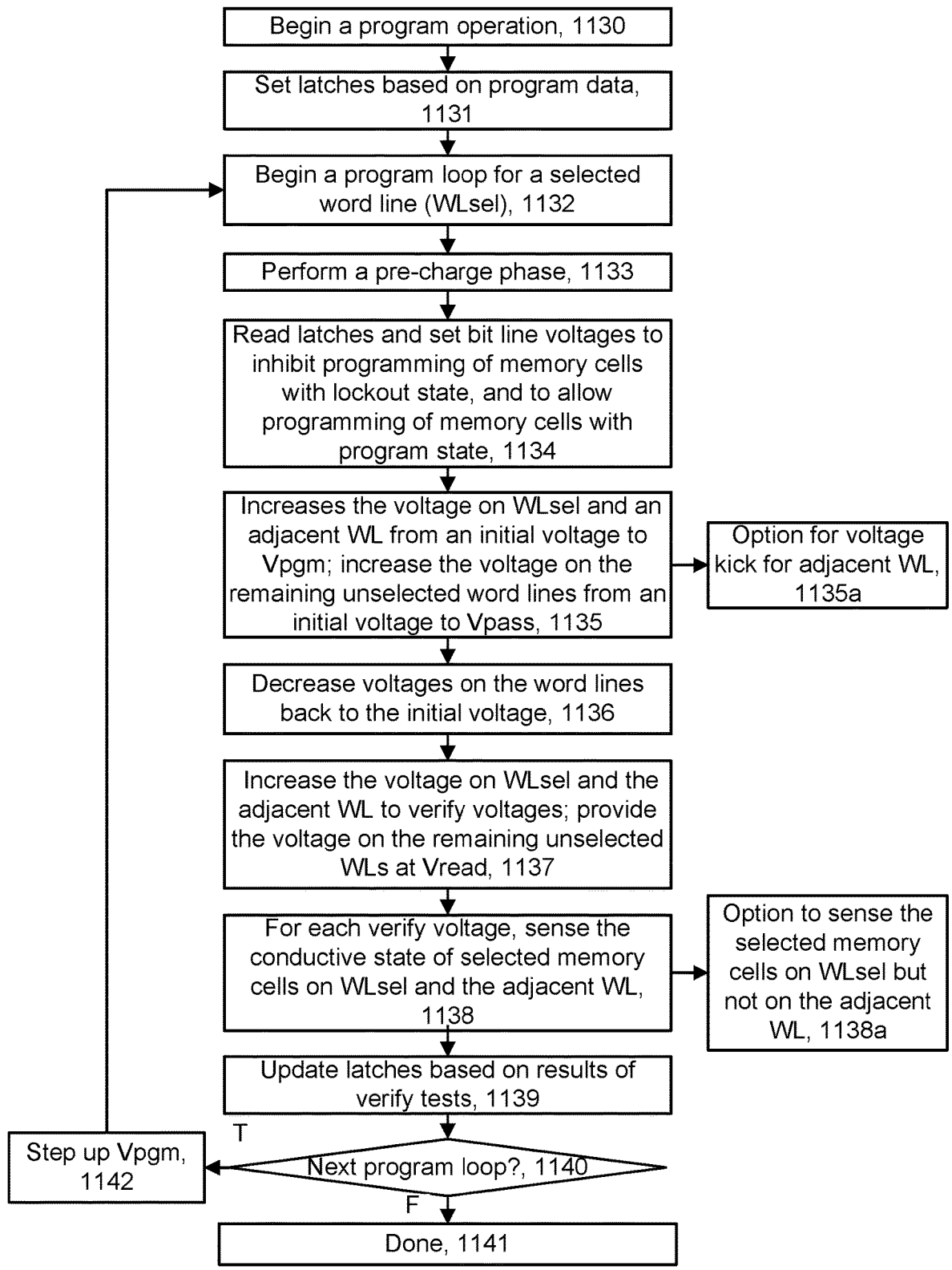
FIG. 11F depicts an example implementation of the process of FIG. 11A in a program operation.

FIG. 11F depicts an example implementation of the process of FIG. 11A in a program operation. Step 1130 begins a program operation. Step 1131 sets latches for the selected memory cells based on program data. For example, the latches may designate a data state which is assigned to a memory cell. If the data state is the erased state, the latches designate that the memory cell has a lockout status and should be inhibited from programming. If the data state is a programmed state, the latches designate that the memory cell has a program status and should be programmed Step 1132 begins a program loop for the selected word line, WLsel. Step 1133 includes performing a pre-charge phase. See FIG. 20 at t0-t3. Step 1134 includes reading the latches of the selected memory cells, e.g., to determine whether the memory cells are in a lockout or program state. The step also includes setting bit line voltages to inhibit programming of memory cells with the lockout state, e.g., by setting Vb1=2 V, and to allow programming of memory cells with the program state, e.g., by setting Vb1=0 V. The program phase occurs next. Step 1135 includes increasing a voltage on WLsel and an adjacent word line (or both adjacent word lines of WLsel) from an initial voltage (e.g., 0 V) to a pass voltage, Vpass. See FIG. 20 at t3-t4.

Step 1135*a* indicates that there is an option to use a voltage kick for the adjacent word line. A voltage kick could also be used for WLsel. For example, assume WLsel is WLL0 in FIG. 8 and WLL1 is an adjacent word line. A set of memory cells (e.g., including memory cells 704-704*g*) is connected to the first word line in a block BLK0. Further, a set of memory cells (e.g., including memory cells 780-780*g*) is connected to the second word line in the block. Data (such as SLC data) can be concurrently programming data into the set of memory cells connected to the first word line and the set of memory cells connected to the second word line. The concurrent programming can involve applying a common program voltage signal to the set of memory cells connected to the first word line and the set of memory cells connected to the second word line. Also, the concurrent programming can involve increasing a voltage on the first word line without a voltage kick (see, e.g., FIG. 20 and plots 2002 and 2004) while increasing a voltage on the second word line with a voltage kick (see, e.g., FIG. 20 and plots 2003*a* and 2005*a*). Separate selectors can be used in a row decoder for WLL0 and WLL1 to provide the voltage signals with and without the voltage kick.

Step 1136 includes decreasing the voltages on the word lines, e.g., WLsel and WLadj, back to the initial voltage. See FIG. 20 at t8. The verify phase occurs next. Step 1137 includes increasing the voltage on WLsel and the adjacent WL to verify levels (e.g., VvE, VvF and VvG in FIG. 20), and providing the voltage on the remaining unselected WLs at Vread. Step 1138 includes performing verify tests for selected memory cells connected to WLn. This includes, for each verify voltage, sensing the conductive state of the selected memory cells on WLsel and the adjacent WL. Optionally, at step 1138*a*, the sensing involves the selected memory cells on WLsel but not memory cells on the adjacent WL. In this case, Vread may be applied to the adjacent WL.

Step 1139 includes updating the latches based on the results of the verify tests. For example, the latches can be updated from the program state to the lockout state for memory cells which pass a verify test at step 1138. A decision step 1140 determines if there is a next program loop. A next program loop may be performed if many memory cells have not completed programming or are otherwise in the program state. If this is true, step 1142 includes stepping up Vpgm, and a next program loop begins at step 1132. If decision step 1140 is false, step 1141 denotes the end of the program operation. The program operation may be ended when all, or nearly all of the memory cells connected to WLn are in the lockout state.

Figure 11G:
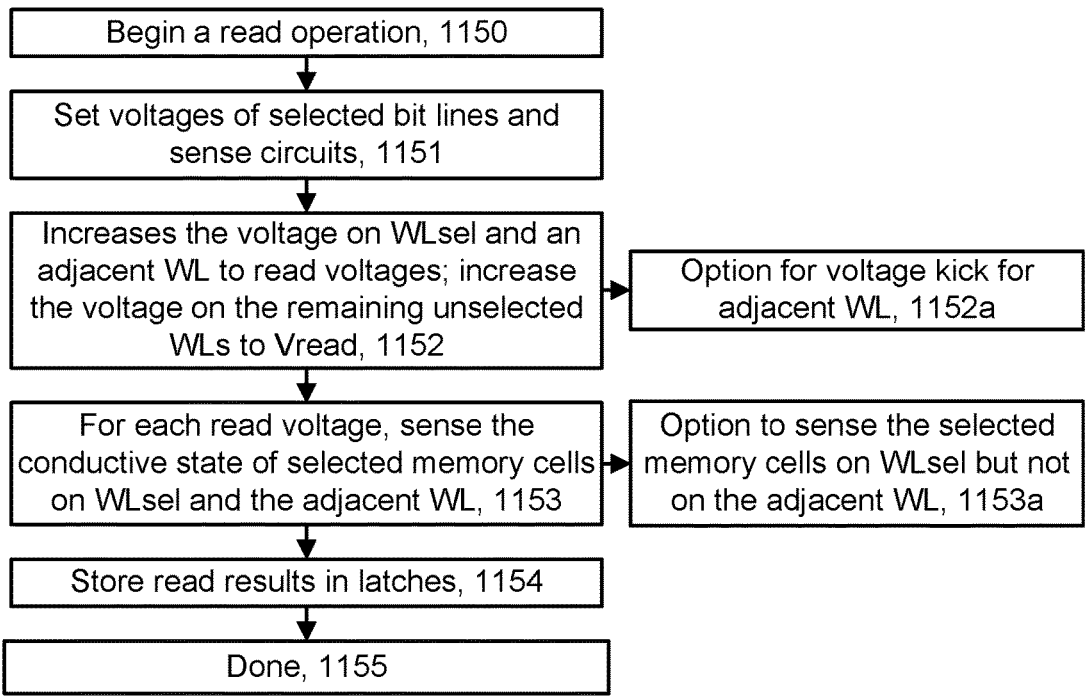
FIG. 11G depicts an example implementation of the process of FIG. 11A in a read operation.

FIG. 11G depicts an example implementation of the process of FIG. 11A in a read operation. A read operation begins at step 1150. Step 1151 includes setting the voltages of selected bit lines and sense circuits. In some cases, a read operation may involve all memory cells of a selected word line so that all bit lines are selected bit lines. A sense circuit may include a sense node which is charged up to a specified voltage. See FIG. 2. Step 1152 includes increasing the voltage on WLsel and an adjacent WL to read voltages, and increasing the voltage on the remaining unselected WLs to Vread. See FIG. 21 and the example read voltages of VrA and VrE. Step 1152*a* indicates that there is an option for a voltage kick for the adjacent WL. A voltage kick could also be used for WLsel. Step 1153 includes, for each read voltage, sensing the conductive state of the selected memory cells on WLsel and the adjacent WL. Optionally, at step 1153*a*, the sensing involves the selected memory cells on WLsel but not memory cells on the adjacent WL. In this case, Vread may be applied to the adjacent WL. Step 1154 includes storing the read results in the latches. For example, a single bit can be stored for each read voltage to indicate whether a memory cell is in a conductive or non-conductive state when the read voltage is applied. The read operation is done at step 1155.

Figure 11H:
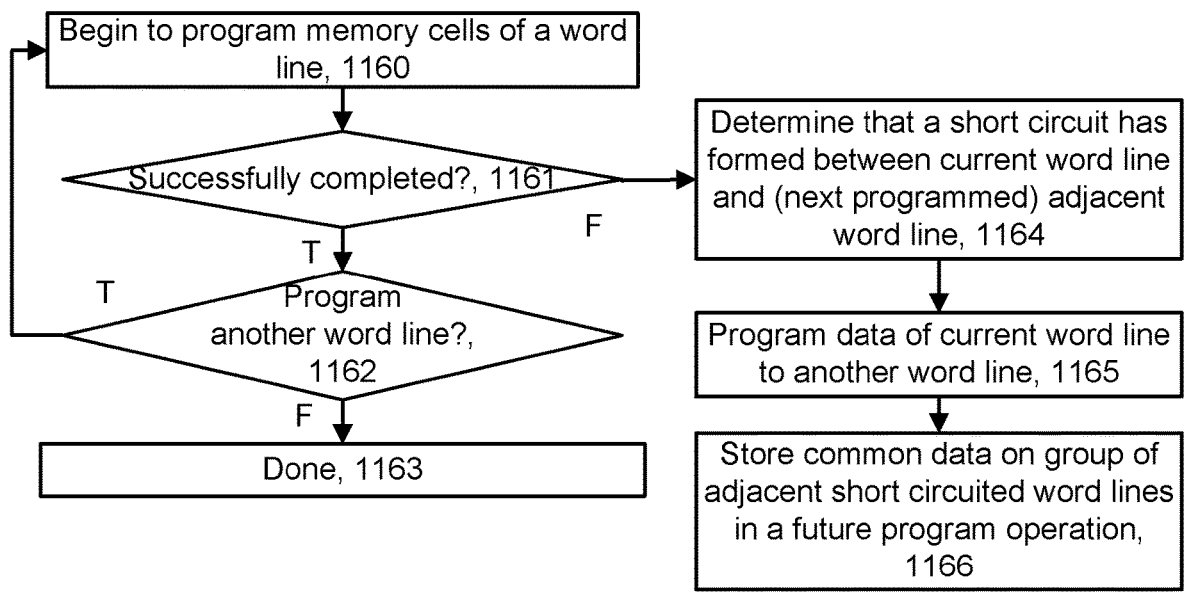
FIG. 11H depicts an example process for detecting a short circuit between word lines during a program operation.

FIG. 11H depicts an example process for detecting a short circuit between word lines during a program operation. In some cases, a short circuit can develop between adjacent word lines. For example, in the stacked memory device of FIG. 5, a short circuit path between adjacent word lines may form in the dielectric layer which is between the word line layers, or between conductive lines which connect voltages to the word lines, for instance. The short circuit prevents the word lines from holding separate voltages, as current will leak between the word lines. In some cases, the short circuit is a soft short circuit such that the current leakage is relatively small and the word lines can hold separate voltages to some extent. A short circuit can be caused for various reasons, such as variations or defects in the fabrication of the memory device. Moreover, the formation of a short circuit between word lines can be induced by the presence of a relatively large electric field between the word lines which exists during programming A short circuit is more likely to develop as a memory device undergoes many program-erase cycles. One way to detect a short circuit is to observe that the memory cells of a word line are not able to complete programming within a maximum allowable number of program loops. In this case, the short circuit is most likely between the currently programmed word line and the previously programmed word line and which is adjacent to and under the currently programmed word line in a stack.

In one embodiment, a short circuit between adjacent word lines can be detected during the programming of a block and steps taken to use the adjacent word lines to store common data. Step 1160 begins to program memory cells of a word line. A decision step 1161 determines whether the programming is successfully completed. For example, the programming may be successfully completed when all, or nearly all, of the memory cells reach a lockout state within a maximum allowable number of program loops, e.g., 20-30 program loops. If decision step 1161 is true, a decision step 1162 determines whether there is another word line to program. If decision step 1162 is true, the next word line is programmed at step 1160. If the decision step 1162 is false, the program operation is done at step 1163.

If the decision step 1161 is false, step 1164 determines that a short circuit has formed between the current word line (WLn) and the next programmed adjacent word line (WLn+1). For example, this can include the current word line which failed to successfully complete programming and the word line above the current word line in the stack which has not been programmed. Step 1165 includes programming data of the current word line to another word line. For example, this could be the second next higher word line in the stack, or a word line in another block. Step 1166 includes storing common data on a group of adjacent short circuited word lines (the word lines identified in step 1164) in a future program operation. In one approach, the respective selectors of the short circuited word lines can supply a common voltage signal to these word lines using techniques described herein. For example, assume WLL0 and then WLL1 are successfully programmed, but then WLL2 is unsuccessfully programmed. The process can decide that WLL3 and WLL2 are short circuited together and should therefore store common data. The map 121 of word lines to pages of data can be updated to reflect that common data is stored on adjacent word lines.

This approach allows the block to continue to be used to store data, compared to other approaches in which a defective block is made entirely ineligible to store data. Moreover, it is possible for multiple instances of short circuited word lines in a block to be detected and accommodated.

Figure 11I:
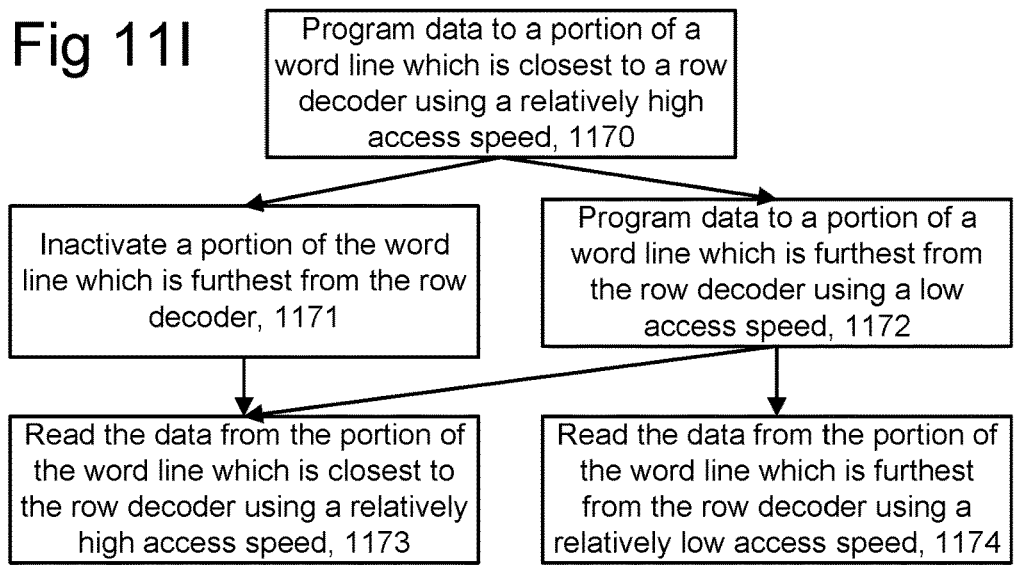
FIG. 11I depicts an example process for programming and reading data from a portion of a word line which is closest to a row decoder using a relatively high access speed.

FIG. 11I depicts an example process for programming and reading data from a portion of a word line which is closest to a row decoder using a relatively high access speed. As described further, e.g., in connection with FIGS. 16E and 19, a RC time constant of a word line is significantly lower when the access to the word line is limited to a portion (a close portion) which is closest to the row decoder. As a result, the close portion of the word line can be reserved for relatively high access speed while a remaining, far portion of the word line can be either unused or accessed with a relatively low access speed. A relatively high or low access speed involves allocating a relatively short or long time period, respectively, for changing a voltage on the word line, such as increasing the voltage. A time period allocated for a same voltage change in a voltage signal is shorter in a relatively high access speed compared to a relatively low access speed.

Step 1170 involves programming data to a portion of a word line which is closest to a row decoder using relatively high access speed. For example, see the portion 1651 in FIG. 16E. Subsequently, step 1171 or 1172 can be followed. Step 1171 involves inactivating a portion of the word line which is furthest from the row decoder. For example, see the portion 1650 in FIG. 16E. This can involve making this portion ineligible to store data. Step 1173 involves reading the data from the portion of the word line which is closest to the row decoder using a relatively high access speed. Step 1172 involves programming data to a portion of a word line which is furthest from the row decoder using a relatively low access speed. For example, see the portion 1650 in FIG. 16E. Step 1174 involves reading the data from the portion of the word line which is furthest from the row decoder using a relatively low access speed. Note that a portion of a word line here refers to the memory cells connected to the portion of the word line. These memory cells form a portion (less than all) of the memory cells connected to the entire word line.

Figure 11J:
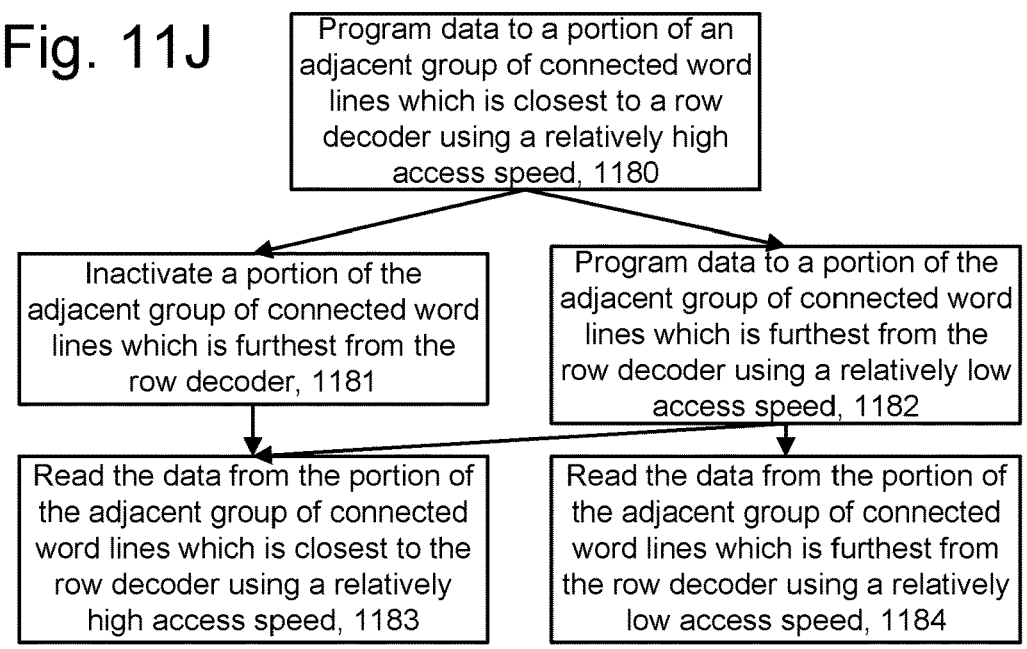
FIG. 11J depicts an example process for programming and reading data from a portion of a group of connected adjacent word lines which is closest to a row decoder using a relatively high access speed.

FIG. 11J depicts an example process for programming and reading data from a portion of a group of connected adjacent word lines which is closest to a row decoder using a relatively high access speed. When accessing a group of connected adjacent word lines, an even higher speed access can be achieved compared to an access of a single word line, because of the lower RC time constant of the group of connected adjacent word lines. Step 1180 involves programming data to a portion of an adjacent group of connected word lines which is closest to a row decoder using relatively high access speed. For example, see the portion 1651 in FIG. 16E. Subsequently, step 1181 or 1182 can be followed. Step 1181 involves inactivating a portion of the adjacent group of connected word lines which is furthest from the row decoder. For example, see the portion 1650 in FIG. 16E. This can involve making this portion ineligible to store data. Step 1183 involves reading the data from the portion of the adjacent group of connected word lines which is closest to the row decoder using a relatively high access speed. Step 1182 involves programming data to a portion of the adjacent group of word lines which is furthest from the row decoder using a relatively low access speed. Step 1184 involves reading the data from the portion of the adjacent group of connected word lines which is furthest from the row decoder using a relatively low access speed.

In one option, the close portion of the word lines can be reserved for SLC memory cells to further increase access speed. The far portion of the word lines, if used, can be reserved for MLC memory cells to increase storage density. In one example implementation, the close and far portions of a word line each store a different page of data.

Figure 11K:
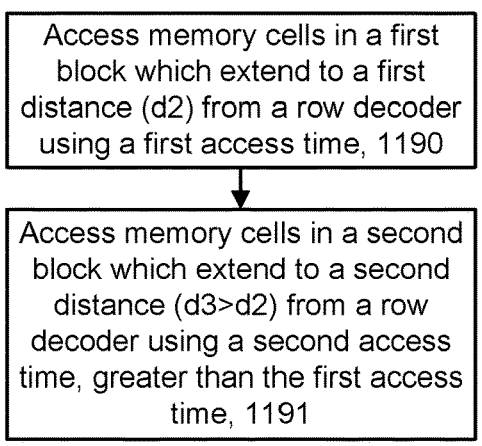
FIG. 11K depicts an example process for accessing memory cells in first and second blocks using different access times.

FIG. 11K depicts an example process for accessing memory cells in first and second blocks using different access times. Step 1190 includes accessing memory cells in a first block which extend to a first distance (d2, see FIG. 16E) from a row decoder (e.g., row decoder 124a in FIG. 16A or 16E) using a first access time. Step 1191 includes accessing memory cells in a second block which extend to a second distance (d3>d2) from a row decoder (e.g., row decoder 124b-124d in FIG. 16A) using a second access time, greater than the first access time. The accessing can including programming or reading, for example. The access time can involve a time period allocated for changing a voltage, such as increasing or decreasing a voltage. The different access times are applied to a same change in a voltage, e.g., from 0 V to Vpass, or from Vpass to Vpgm for, example.

In one approach, the first block comprises SLC memory cells which are accessed using a relatively short access time period, and the second block comprises MLC memory cells which are accessed using a relatively long access time period. For instance, in FIG. 16A, the first block can be BLK0 and the second block can be BLK1. The first and second block may have a shared set of bit lines BL0-BL15 connected to their NAND strings.

FIG. 12A depicts a further view of the stack 610 of FIG. 5A showing terraced control gate layers and a first example of connections to contacts, where each word line layer is connected to a separate contact. In this example, the control gate layers, including the select gate layers and the word line layers, form a terrace or staircase at one end of the block. A via is formed on an exposed top portion of each control gate layer. Each via may extend to a metallization layer above the stack, where contacts or contact pads are formed on the vias. The vias may comprise metal or other conductive material. The contacts may be metal and extend to a row decoder to receive voltages for application to the control gate layers. Each contact may be connected to one or more vias.

In this example, a contact N is connected to a via 1226 which in turn is connected to the SGS layer. Contact M is connected to vias 1224 and 1225, respectively, which in turn are connected to the WLDS1 and WLDS0 layers, respectively. Contacts C-L are connected to vias 1214-1223, respectively, which in turn are connected to the WLL9-WLL0 layers, respectively. Contact B is connected to vias 1212 and 1213, respectively, which in turn are connected to the WLD0 and WLD1 layers, respectively. Contact A0 is connected to vias 1210 and 1211, respectively, which in turn are connected to the SGD0(0) and SGD1(0) layers, respectively. SGD0(0) and SGD1(0) layers are used in SB0. Other SGD layers which are not shown here but are shown in FIGS. 6 and 7 are used in SB1-SB3.

This example allows a common voltage signal to be applied to a selected word line and an adjacent word line separately via respective selectors of a row decoder. That is, separate instance of a common voltage signal are applied to a selected word line and an adjacent word line. The selected word line and an adjacent word line are not connected to one another in this example.

FIG. 12B depicts an example of the map 119 of control gate layers to contacts of FIG. 1, consistent with FIG. 12A. As mentioned, e.g., in connection with FIG. 1, the memory device can store a map which indicates connections between contacts and control gate (CG) layers, to allow voltage signals to be provided on the appropriate control gate layers. The memory device can provide control signals to selectors in the row decoders to pass one input voltage to a respective contact, as described, e.g., in connection with FIG. 15A-15D.

The SGD0(0) and SGD1(0) layers (i.e., SGD0/1(0)) are connected to the contact A0 of FIG. 12A. The SGD0(0) and SGD1(0) layers (i.e., SGD0/1(1)), SGD0(2) and SGD1(2) layers (i.e., SGD0/1(2)), and the SGD0(3) and SGD1(3) layers (i.e., SGD0/1(3)), are connected to contacts A1, A2 and A3, respectively (not shown). The WLD0 and WLD1 layers (i.e., WLD0/1) are connected to the contact B, the WLL9-WLL0 layers are connected to the contacts C-L, respectively, the WLDS0 and WLDS1 layers (i.e., WLDS0/1) are connected to the contact M, and the SGS layer is connected to the contact N of FIG. 12A.

FIG. 12C depicts an example of the map 121 of word lines to pages of data of FIG. 1, consistent with FIG. 12A. The memory device can program and read data in units of pages, where typically one or more pages are stored per word line. In this example, one page is stored per word line, and a different page is stored in each word line of memory cells. The map allows the memory device to keep track of the data it stores.

In another option, one page of data is stored redundantly in multiple word lines such as multiple adjacent word lines. For example, the map of FIG. 13D could be achieved with the structure of FIG. 12A.

FIG. 13A depicts a further view of the stack 610 of FIG. 5A showing terraced control gate layers and a second example of connections to contacts, where pairs of word line layers WLL0 and WLL1, WLL2 and WLL3, WLL4 and WLL5, WLL6 and WLL7, and WLL8 and WLL9, are connected to separate contacts. In this example, a contact N is connected to the via 1226 which in turn is connected to the SGS layer. Contacts A0, B, M and N are connected to vias as discussed in connection with FIG. 12A. Contact G1 is connected to vias 1222 and 1223, respectively, which in turn are connected to the WLL1 and WLL0 layers, respectively. Contact F1 is connected to vias 1220 and 1221, respectively, which in turn are connected to the WLL3 and WLL2 layers, respectively. Contact E1 is connected to vias 1218 and 1219, respectively, which in turn are connected to the WLL5 and WLL4 layers, respectively. Contact D1 is connected to vias 1216 and 1217, respectively, which in turn are connected to the WLL7 and WLL6 layers, respectively. Contact C1 is connected to vias 1214 and 1215, respectively, which in turn are connected to the WLL9 and WLL8 layers, respectively.

Assuming WLL2 is a selected word line, the via 1221 is an example of a first via extending upwards from the selected word line to a contact F1, and the via 1220 is an example of a second via extending upwards from the adjacent word line WLL3 to the contact, where the contact is connected to the row decoder. Further, WLL2 and WLL3 are part of a group 1310 of two or more adjacent word lines.

This example allows a common voltage signal to be applied to pairs of adjacent word lines, e.g., WLL0 and WLL1, WLL2 and WLL3, WLL4 and WLL5, WLL6 and WLL7, and WLL8 and WLL9. This approach allows for a relatively high access speed of all of the data memory cells of the block. The data memory cells can be SLC memory cells for high speed programming and reading.

FIG. 13B depicts a top view of the stack of FIG. 13A. The view is in the x-y plane and shows the vias and respective contacts of FIG. 13A. The vias have a circular cross section and extend vertically as columns between the contacts and control gate layers, for example. Conductive paths, not shown, connect the contacts to a row decoder. See also FIG. 15A-15D. The contacts A1-A3 are not shown in FIG. 13A but are connected to vias in accordance with the maps of FIGS. 12B, 13C and 14C.

FIG. 13C depicts an example of the map 119 of control gate layers to contacts of FIG. 1, consistent with FIG. 13A. The map is similar to the map of FIG. 12A except that two data word lines are connected to each contact. For example, WLL0 and WLL1 (i.e., WLL0/1) are connected to the contact G1, WLL2 and WLL3 (i.e., WLL2/3) are connected to the contact F1, WLL4 and WLL5 (i.e., WLL4/5) are connected to the contact E1, WLL6 and WLL7 (i.e., WLL6/7) are connected to the contact D1, and WLL8 and WLL9 (i.e., WLL8/9) are connected to the contact C1. Thus, a voltage applied to any of the contacts C1-G1 will be a common voltage which reaches the associated pair of word lines.

FIG. 13D depicts an example of the map 121 of word lines to pages of data of FIG. 1, consistent with FIG. 13A. Each pair of adjacent word lines stores one page of data in this example. WLL0/1, WLL2/3, WLL4/5, WLL6/7 and WLL8/9 store page0, page1, page2, page3 and page4, respectively.

FIG. 14A depicts a further view of the stack 610 of FIG. 5A showing terraced control gate layers and a third example of connections to contacts, where pairs of word line layers WLL0 and WLL1, and WLL2 and WLL3, are connected to separate contacts, and single word line layers WLL4-WLL9 are connected to separate respective contacts. Contacts A0, B, M and N are connected to vias as discussed in connection with FIG. 12A. Contacts F1 and G1 are connected to vias as discussed in connection with FIG. 13A. Contact E-H are connected to vias 1216-1219, respectively, which in turn are connected to WLL9-WLL4 layers, respectively.

This example allows a common voltage signal to be applied to pairs of adjacent word lines, e.g., WLL0 and WLL1, and WLL2 and WLL3, while remaining word lines WLL4-WLL9 can be independently driven. This approach allows for a relatively high access speed of some of the data memory cells of the block and a relatively low access speed of other data memory cells of the block. For example, the data memory cells connected to WLL0-WLL3 can be SLC memory cells for relatively high speed programming and reading, with a low storage density, and the data memory cells connected to WLL4-WLL9 can be MLC memory cells for lower speed programming and reading, with a high storage density.

FIG. 14B depicts a top view of the stack of FIG. 14A. The view is similar to that of FIG. 13B except the data word line layers WLL4-WLL9 are connected to separate respective contacts.

FIG. 14C depicts an example of the map 119 of control gate layers to contacts of FIG. 1, consistent with FIG. 14A. The map is similar to that of FIG. 13C except WLL9-WLL4 are connected to contacts C-H, respectively.

FIG. 14D depicts an example of the map 121 of word lines to pages of data of FIG. 1, consistent with FIG. 14A. The map is similar to that of FIG. 13D except WLL4-WLL9 store data for pages2-page7, respectively. As mentioned, this approach allows some pairs or other groups of adjacent word lines to store one page of data with a relatively high access speed and low storage density, while allowing other single word lines to store a respective page of data with lower speed access and high storage density. This provides flexibility in configuring a block.

Figure 15A:
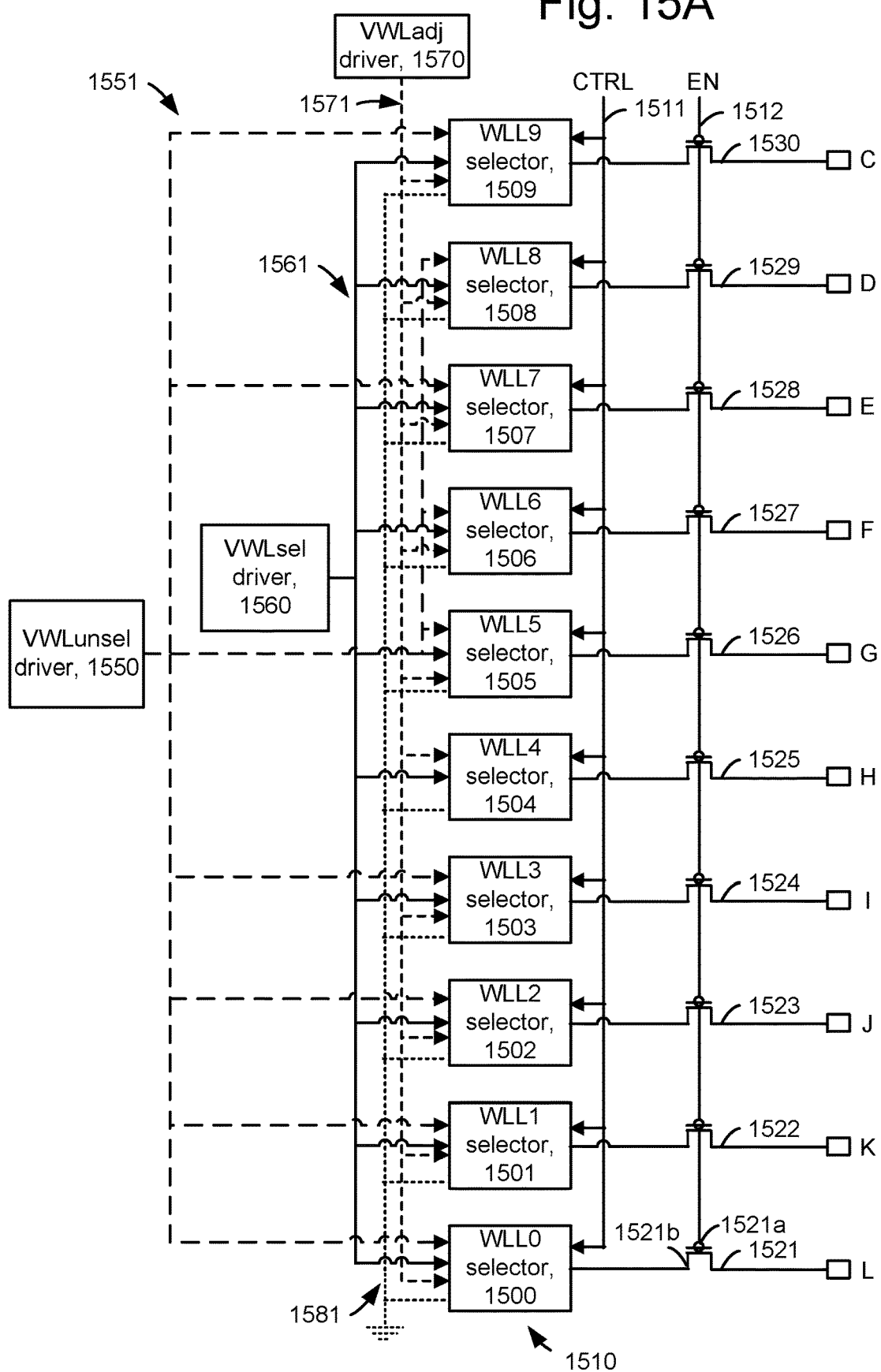
FIG. 15A depicts an example implementation of a row decoder and connections to contacts for word line layers, consistent with FIG. 12A-12C.

FIG. 15A depicts an example implementation of a row decoder and connections to contacts for word line layers, consistent with FIG. 12A-12C. The row decoders of FIG. 15A-15D are examples of the row decoder 124 of FIG. 1. The row decoder 1510 includes a number of word line selectors 1500-1509 which are configured to pass a voltage from a voltage driver to the contacts L-C, respectively. A row decoder allows a small number of voltage signals from voltage drivers to be connected to a larger number of word lines. A less efficient option is to have a separate voltage driver for each word line or contact.

Each selector can pass a voltage to one respective contact, and each contact is connected to one respective via and control gate layer. Selectors can also be provided for the select gate layers and dummy word line layers also, but are omitted for simplicity. Each selector receives voltage signals from a number of voltage drivers. For example, voltage signals may be provided by an unselected word line voltage driver (VWLunsel driver 1550) via paths 1551, by a selected word line voltage driver (VWLsel driver 1560) via paths 1561, and by an adjacent word line voltage driver (VWLadj driver 1570) via paths 1571. A ground path 1581 may also be connected to each selector.

Each selector receives a control signal CTRL via a path 1511. The control signal commands the selector to pass VWLsel, VWLunsel or VWLadj to the respective contact, or to ground the respective contact via the ground path. Another option is to provide the selector in an off position, in which case the contact is not connected to ground or to any of the input voltage signals from the voltage drivers. A word line voltage may float in this situation unless it is connected to another word line driver via a switch such as in FIG. 15D, in which case it can receive a voltage signal via the switch. Each selector may be connected to its respective contact via a pass gate which is controlled by an enable signal (EN) on a path 1512. EN may be set high, for instance, to provide the pass gates in a conductive state to connect the contact to the selector. EN can be connected to the control gates of the pass transistors (such as the control gate 1521a of the example pass gate 1521b). Each selector 1500-1509 may be connected to its respective contact L-C, respectively, via a path 1521-1530, respectively, which includes a pass gate.

Figure 15B:
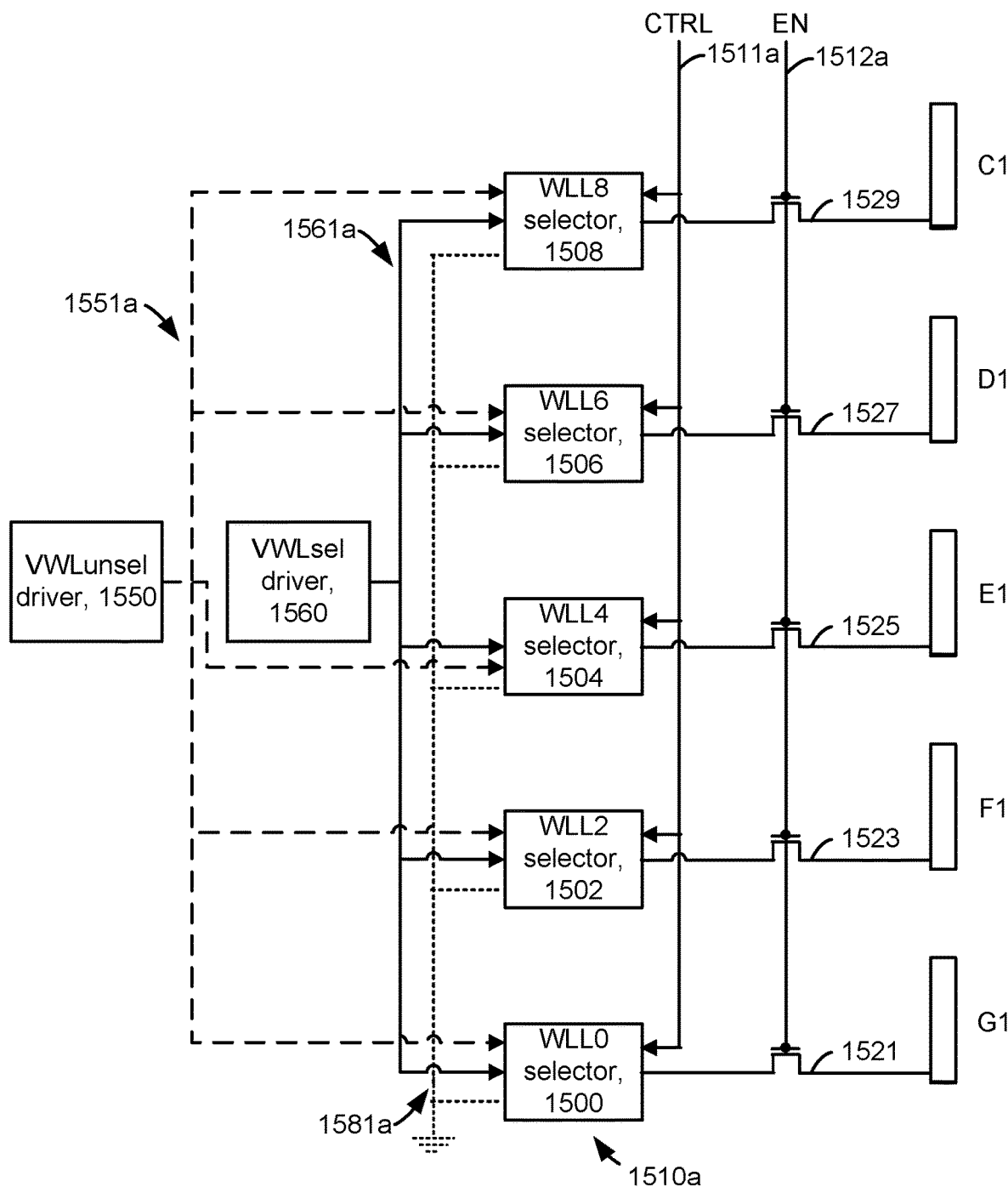
FIG. 15B depicts an example implementation of a row decoder and connections to contacts for word line layers, consistent with FIG. 13A-13D.

FIG. 15B depicts an example implementation of a row decoder and connections to contacts for word line layers, consistent with FIG. 13A-13D. The row decoder 1510a includes half as many word line selectors as FIG. 15A since each word line selector is connected to two word lines via its respective contact. This reduces complexity and costs. In particular, the word line selectors 1500, 1502, 1504, 1506 and 1508 are configured to pass a voltage from a voltage driver to the contacts G1, F1, E1, D1 and C1, respectively. Each selector can pass a voltage to one respective contact, and each contact is connected to two respective vias and control gate layers. In this example, the VWLunsel driver 1550 and the VWLsel driver 1560 provide voltage signals to the selectors via the paths 1551a and 1561a, respectively. The VWLadj driver 1570 of FIG. 15A is omitted since each pair of word lines is driven by a same voltage signal. A ground path 1581a may also be connected to each selector.

Each selector receives a control signal CTRL via a path 1511a. The control signal commands the selector to pass VWLsel or VWLunsel to the respective contact, or to ground the respective contact via the ground path. Each selector may be connected to its respective contact via a pass gate which is controlled by an enable signal (EN) on a path 1512a. Each selector 1500, 1502, 1504, 1506 and 1508 may be connected to its contact G1, F1, E1, D1 and C1, respectively, via a path 1521, 1523, 1525, 1527 and 1529, respectively, which includes a pass gate.

Figure 15C:
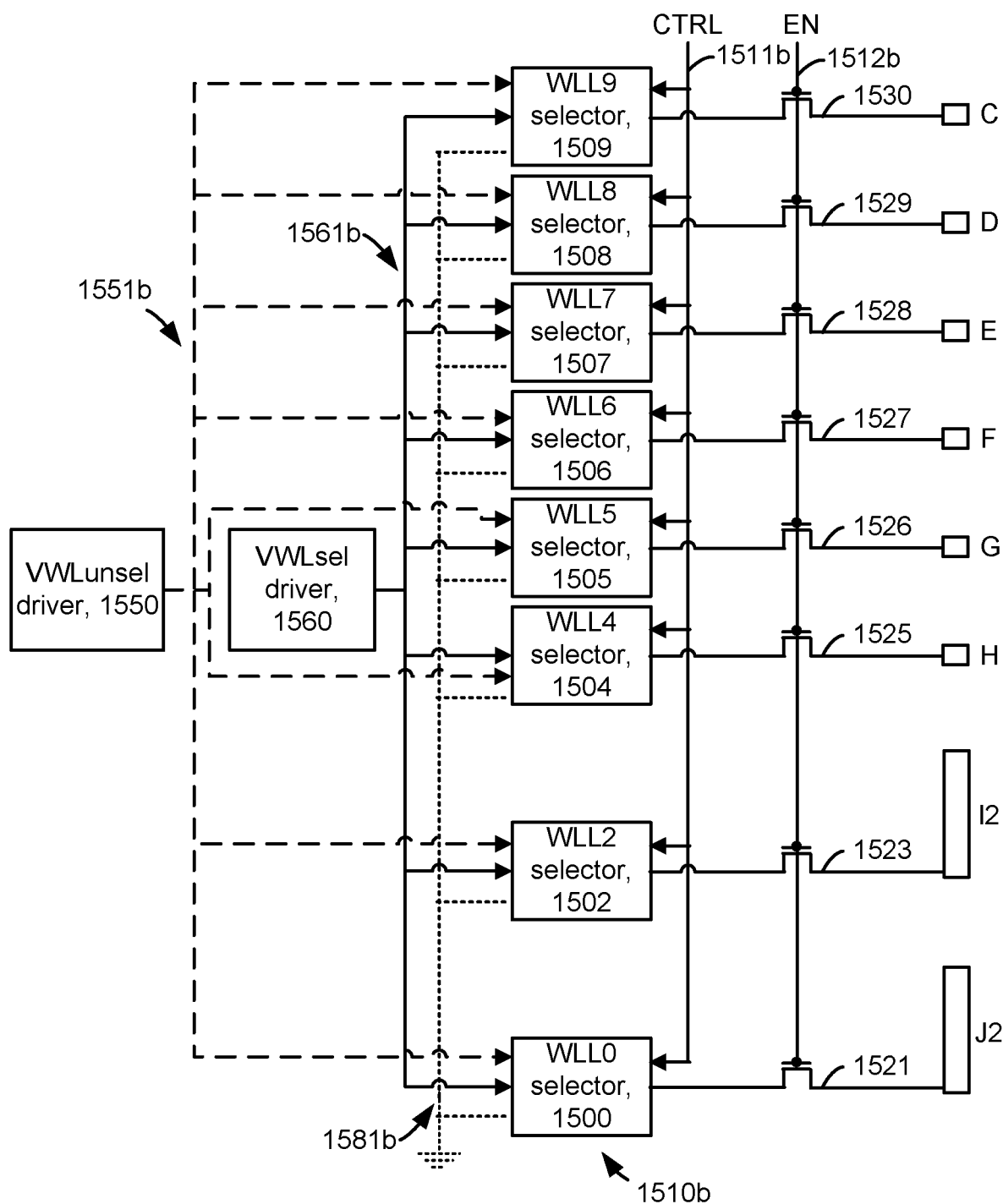
FIG. 15C depicts an example implementation of a row decoder and connections to contacts for word line layers, consistent with FIG. 14A-14D.

FIG. 15C depicts an example implementation of a row decoder and connections to contacts for word line layers, consistent with FIG. 14A-14D. The row decoder 1510b includes two fewer word line selectors than FIG. 15A since two of the word line selectors are each connected to two word lines via a respective contact. In particular, the word line selectors 1500 and 1502 are configured to pass a voltage from a voltage driver to the contacts J2 and I2, respectively. The word line selectors 1504-1509 are configured to pass a voltage from a voltage driver to the contacts H-C, respectively. Each of the contacts J2 and I2 is connected to two respective vias and control gate layers. In this example, the VWLunsel driver 1550 and the VWLsel driver 1560 provide voltage signals to the selectors via the paths 1551b and 1561b, respectively. The VWLadj driver 1570 of FIG. 15A is omitted since each pair of word lines connected to J2 and I2 is driven by a same voltage signal. However, it is possible to use the VWLadj driver 1570 with the selectors 1504-1509 in a similar manner as discussed in connection with FIG. 15A. A ground path 1581b may also be connected to each selector.

Each selector receives a control signal CTRL via a path 1511b. The control signal commands the selector to pass VWLsel or VWLunsel to the respective contact, or to ground the respective contact via the ground path. Each selector may be connected to its respective contact via a pass gate which is controlled by an enable signal (EN) on a path 1512b. Each selector 1500 and 1502 may be connected to its contact J2 and I2, respectively, via a path 1521 and 1523, respectively, which includes a pass gate. Each selector 1504-1509 may be connected to its contact H-C, respectively, via a path 1525-1530, respectively, which includes a pass gate.

Figure 15D:
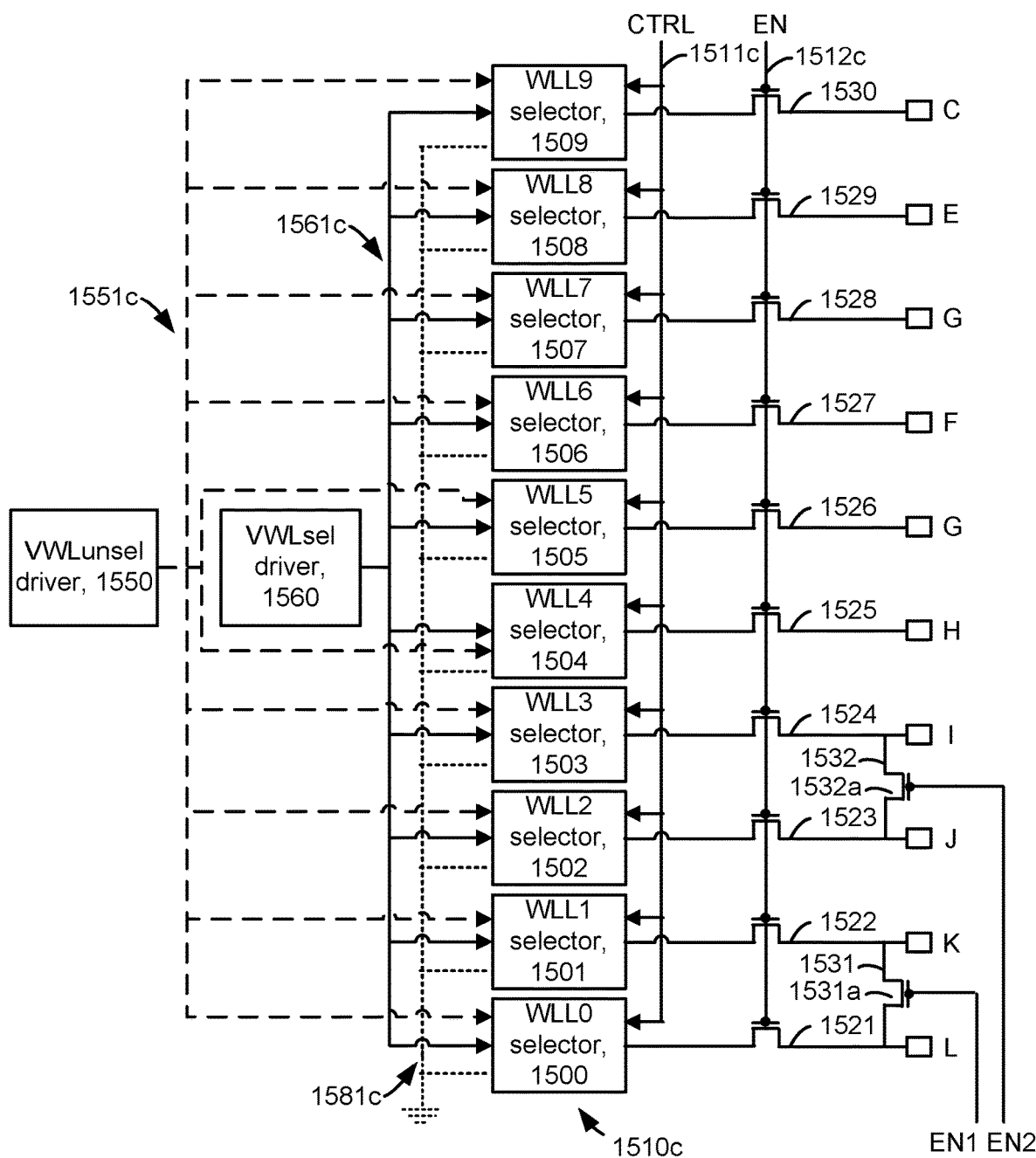
FIG. 15D depicts an example implementation of a row decoder and connections to contacts for word line layers, similar to FIG. 15A but with switched paths between WLL0 and WLL1, and between WLL2 and WLL3.

FIG. 15D depicts an example implementation of a row decoder and connections to contacts for word line layers, similar to FIG. 15A but with switched paths between WLL0 and WLL1, and between WLL2 and WLL3. The configuration is similar to that of FIG. 15A except that a switch 1531a in a path 1531 can be set to connect the contacts K and L, and a switch 1532a in a path 1532 can be set to connect the contacts I and J. This example provides two pairs of contacts which can be switchably connected or disconnected. In another option, each pair of data word lines can be switchably connected or disconnected. In another option, groups of three or more adjacent word lines can be can be switchably connected or disconnected. The switches 1531*a* and 1532*a* are controlled by enable signals EN1 and EN2, respectively. The enable signals may be set high, for instance, to provide the switches in a conductive state to close the path and electrically connect the contacts and the respective word lines to each other. By switchably connecting the word lines, a flexibility is provided to use the word lines in pairs or other groups for relatively high access speed and low storage density, or to use single word lines for storing data with a lower speed access but a higher storage density. Moreover, both connected and unconnected word lines can be used in a block.

When the switch 1531*a* is closed and the contacts K and L (and paths 1522 and 1521) are electrically connected, the contacts can be driven by one of the word line selectors 1500 or 1501, but not both, in one approach. For example, if the WLL0 selector 1500 is used to pass an input voltage from the VWLsel driver 1560, the WLL1 selector 1501 can be provided in an off state in which it does not pass an input voltage from the drivers 1550 and 1560.

In this example, the VWLunsel driver 1550 and the VWLsel driver 1560 provide voltage signals to the selectors via the paths 1551*c* and 1561*c*, respectively. It is also possible to use the VWLadj driver 1570 with the selectors 1504-1509 in a similar manner as discussed in connection with FIG. 15A. It is also possible to use the VWLadj driver 1570 with the selectors 1500-1503 in a similar manner as discussed in connection with FIG. 15A, when the switched paths are open and do not connect the contacts. A ground path 1581*c* may also be connected to each selector.

Each selector receives a control signal CTRL via a path 1511*c*. The control signal commands the selector to pass VWLsel or VWLunsel to the respective contact, or to ground the respective contact via the ground path. Each selector may be connected to its respective contact via a pass gate which is controlled by an enable signal (EN) on a path 1512*c*.

Figure 16A:
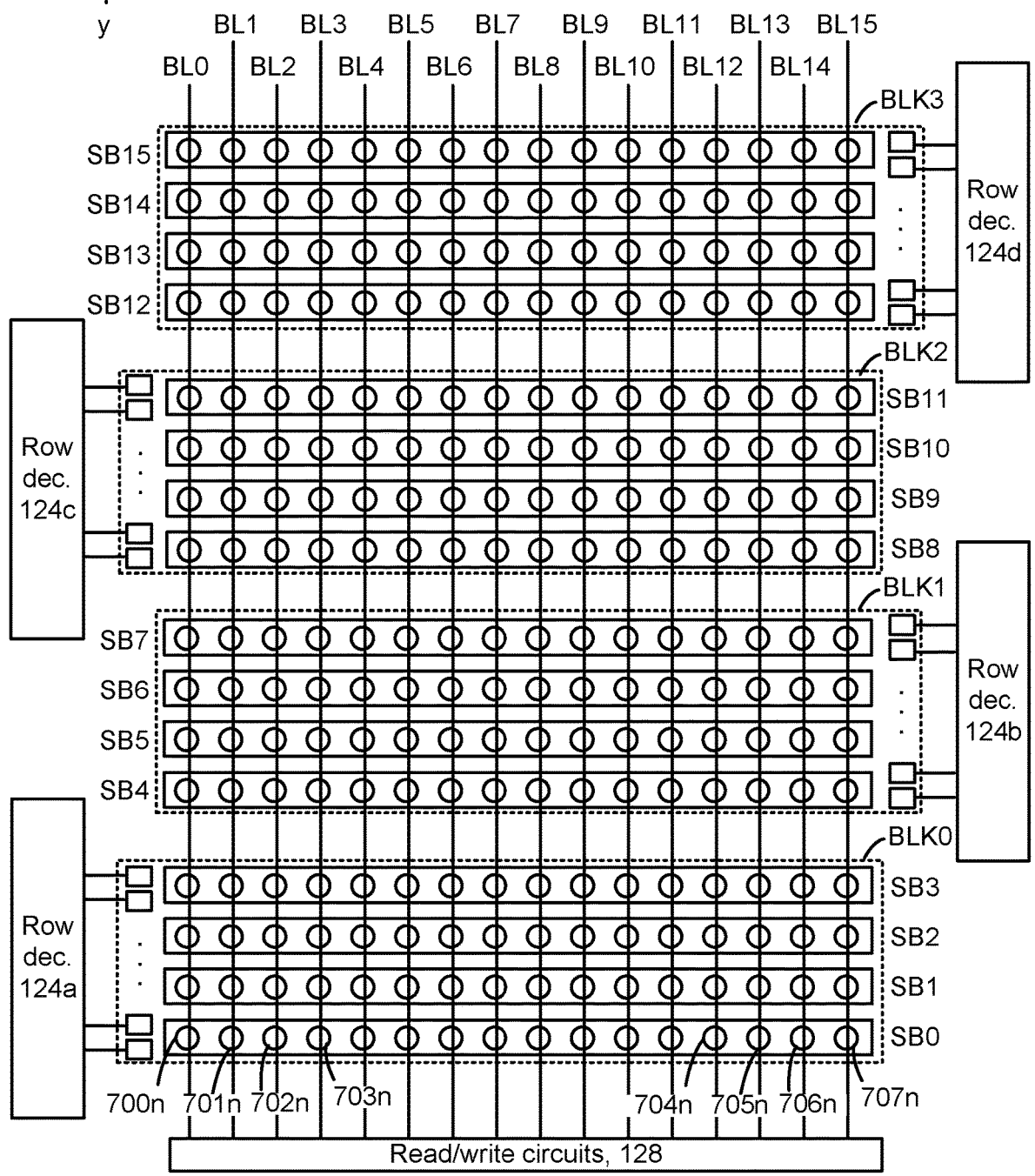
FIG. 16A depicts a top view of the set of blocks BLK0-BLK3 of FIG. 4, depicting NAND strings, row decoders and bit lines.

FIG. 16A depicts a top view of the set of blocks BLK0-BLK3 of FIG. 4, depicting NAND strings, row decoders and bit lines. The NAND strings are represented by circles. Example NAND strings 700*n*-703*n* and 704*n*-707*n* are provided in SB0, consistent with FIG. 8. In a simplified example, each sub-block includes sixteen NAND strings. Similarly, there are sixteen bit lines BL0-BL15 which are shared by the different blocks. The bit lines are connected to the read/write circuits 128, discussed in connection with FIG. 1. BLK0, BLK1, BLK2 and BLK3 include sub-blocks SB0-SB3, SB4-SB7, SB8-SB11 and SB12-SB15, respectively. Additionally, a row decoder is associated with each block. In this example, the row decoders alternate between the left and right hand side of the blocks to allow extra room for the layout of the row decoders. In another option, the row decoder are all on the same side of the blocks. The row decoders 124*a*-124*d* are associated with blocks BLK0-BLK3, respectively. The row decoders are connected to example contacts which are represented by squares.

In one example, BLK0 is used for relatively high access speed with SLC memory cells storing common data on adjacent word lines, and BLK1-BLK3 are used with MLC memory cells storing data on single word lines. In this case, a number of bits stored per memory cell (a storage density) for the set of memory cells connected to the plurality of word lines in the second block is greater than a number of bits stored per memory cell for the selected word line and an adjacent word line in the first block.

Also, the word line activation circuit can be configured to allocate a time period (e.g., t1 in FIG. 18) for changing a voltage on the selected word line and the adjacent word line in the first block which is less than a time period (e.g., t2 in FIG. 18) allocated for changing a voltage on one of the word lines in the second block.

BLK0 may be selected for relatively high access speed because it is the closest block to the read/write circuits. Different time periods can be allocated for changing a bit line voltage based on a distance of a block from the read/write circuits, with a shorter time being allocated when the distance is smaller.

BLK0 can be a first block which includes groups of data word lines which are connected to one another, and BLK1 can be a second block which does not include groups of data word lines which are connected to one another. The second block may include a set of memory cells connected to a plurality of word lines, where the plurality of word lines comprise word lines disconnected from adjacent word lines, and the first block and the second block share a common set of bit lines.

Further, the high speed block can be used as a cache for the lower speed blocks. For example, in a program operation for a lower speed block, the data can be initially programmed to a higher speed block and then transferred to the lower speed block. It is also possible for data to be initially programmed to a higher speed portion of a block and then transferred to a lower speed portion of the block. These approaches allow the external controller to realize a relatively high access speed when programming and reading memory cells, and then turn its attention to other tasks while data is subsequently moved internally within a block or between blocks to memory cells with lower access speed.

FIG. 16B depicts an example architecture consistent with FIG. 16A. The approach of FIG. 16A allows for a memory device on one chip to provide high and low access speeds. Computing systems are often limited by the access speed of their memory rather than by CPU speed. One approach is to provide a dedicated cache such as storage class memory or SLC fast cache on one chip for use by a lower speed memory on another chip. However, this results in performance and costs penalties due to interconnections between the chips and associated RC delays. Also, the fabrication process is more complex. Instead, as described herein, by using a portion of the memory cells on a chip as a high speed cache while another portion is used for long term storage, costs can be reduced while a competitive cache speed and a compact architecture are achieved.

The example architecture combines CPUs and memory devices in four units 1630*a*-1630*d* to allow data transfer between the memory devices.

In particular, in a unit 1630*a*, a CPU 1630 can be provided with a high speed cache such as an L1, L2 or L3 cache 1631. The CPU could be the processor 122*c* in the off-chip controller 122 of FIG. 1, for example. A memory 1632 represents the set of blocks of FIG. 16A on a common chip, while the cache 1633 represents a portion of the blocks which provide high access speeds. This could be one or more high speed SLC blocks with connected word lines or a portion of a block with SLC memory cells on connected word lines, for example. A remaining portion of the memory may include lower speed MLC blocks with disconnected word lines, or portion of a block with MLC memory cells on disconnected word lines, for example.

Similarly, a unit 1630*b* includes a CPU 1636 with an L1, L2 or L3 cache 1637, and a memory 1634 with a cache 1635, a unit 1630*c* includes a CPU 1638 with an L1, L2 or L3 cache 1639, and a memory 1640 with a cache 1641, and a unit 1630*d* includes a CPU 1644 with an L1, L2 or L3 cache 1645, and a memory 1642 with a cache 1643. The memory devices 1632, 1634, 1640 and 1642 may communicate with one another to transfer data.

FIG. 16C depicts an example computing-centric architecture. This approach includes a memory on one chip and a CPU on another chip, with a DRAM between them. The CPU includes an L1, L2 or L3 cache. As mentioned, this approach has overhead costs due to the cache and the memory being on different chips. In particular, a unit 1660*a* includes a CPU 1662 (with an L1, L2 or L3 cache 1663), a memory 1660 and a DRAM 1661 between the CPU and the memory. A unit 1660*b* includes a CPU 1664 (with an L1, L2 or L3 cache 1665), a memory 1667 and a DRAM 1666 between the CPU and the memory. A unit 1660*c* includes a CPU 1672 (with an L1, L2 or L3 cache 1673), a memory 1670 and a DRAM 1671 between the CPU and the memory. A unit 1660*d* includes a CPU 1674 (with an L1, L2 or L3 cache 1675), a memory 1677 and a DRAM 1676 between the CPU and the memory. The CPUs 1662, 1664, 1672 and 1674 may communicate with one another.

FIG. 16D depicts an example memory-centric architecture. This approach includes a memory on one chip and a CPU on another chip, with a cache between them. This approach also has overhead costs due to the CPU cache and the memory being on different chips. A unit 1680*a* includes a CPU 1680 (with an L1, L2 or L3 cache 1681), a memory 1683 and a cache 1682 between the CPU and the memory. A unit 1680*b* includes a CPU 1686 (with an L1, L2 or L3 cache 1687), a memory 1684 and a cache 1685 between the CPU and the memory. A unit 1680*c* includes a CPU 1688 (with an L1, L2 or L3 cache 1689), a memory 1691 and a cache 1690 between the CPU and the memory. A unit 1680*d* includes a CPU 1694 (with an L1, L2 or L3 cache 1695), a memory 1692 and a cache 1693 between the CPU and the memory. The memory devices 1683, 1684, 1691 and 1692 may communicate with one another to transfer data.

Figure 16E:
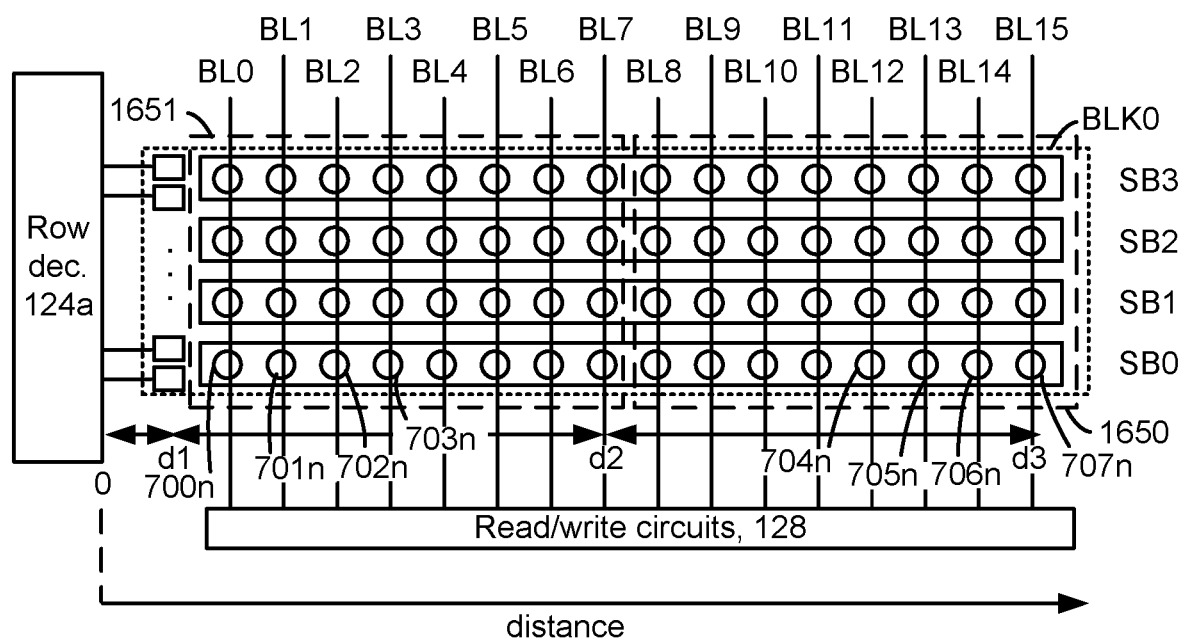
FIG. 16E depicts BLK0 of FIG. 16A, showing how the NAND strings are arranged at different distances from the row decoder.

FIG. 16E depicts BLK0 of FIG. 16A, showing how the NAND strings are arranged at different distances from the row decoder. As discussed in connection with FIGS. 11I and 11J, it is possible to use a relatively high access speed when accessing a portion of a word line which is relatively close to a row decoder, which supplies a voltage signal to the word line. In this example, a portion 1651 of the block or its word lines is relatively close to the row decoder 124*a*, and a portion 1650 of the block or its word lines is relatively far from the row decoder 124*a*. This approach divides the memory cells into two portions, but it is possible to use more than two portions. For example, there can be a relatively close portion for which a relatively high access speed is used, a relatively far portion for which a relatively low access speed is used, and an intermediate portion for which an intermediate access speed is used. The intermediate access speed is between the relatively low access speed and the relatively high access speed. The close portion 1651 includes the example NAND strings 700*n*-703*n* and the far portion includes the example NAND strings 704*n*-707*n*, consistent with FIG. 8.

In particular, the close portion 1651 extends in a range of distances d1-d2 from the row decoder and the far portion 1650 extends in a range of distances d2-d3 (greater than the range d1-d2) from the row decoder. In other words, the close portion 1651 extends to a distance d2 from the row decoder and the far portion 1650 extends from the distance d2 to a distance d3>d2 from the row decoder.

Figure 17A:
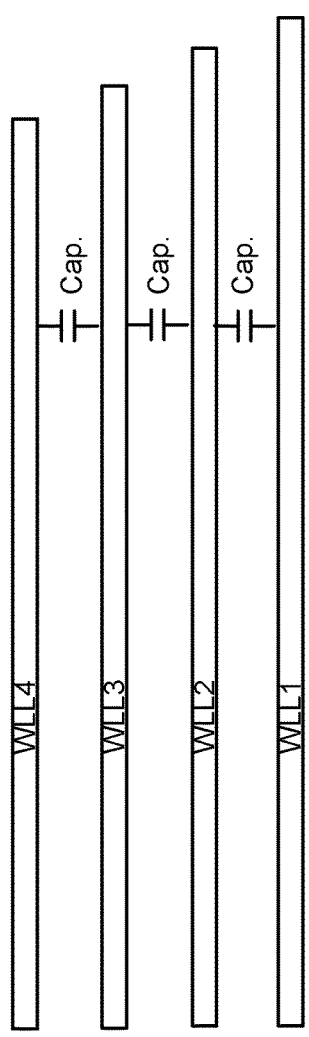
FIG. 17A depicts example word line layers WLL1-WLL4, showing how a capacitance exists between adjacent word line layers which are disconnected.

FIG. 17A depicts example word line layers WLL1-WLL4, showing how a capacitance (Cap.) exists between adjacent word line layers which are disconnected. The magnitude of the capacitance depends on factors such as the spacing between the word lines, the materials and widths of the word lines and the dielectric layers. In this example, a desired change in the voltage of a selected word line is slowed by the capacitance of the selected word line relative to its two adjacent neighbors. For example, a desired change in the voltage of WLL3 is slowed by its capacitance with WLL2 and WLL4.

Figure 17B:
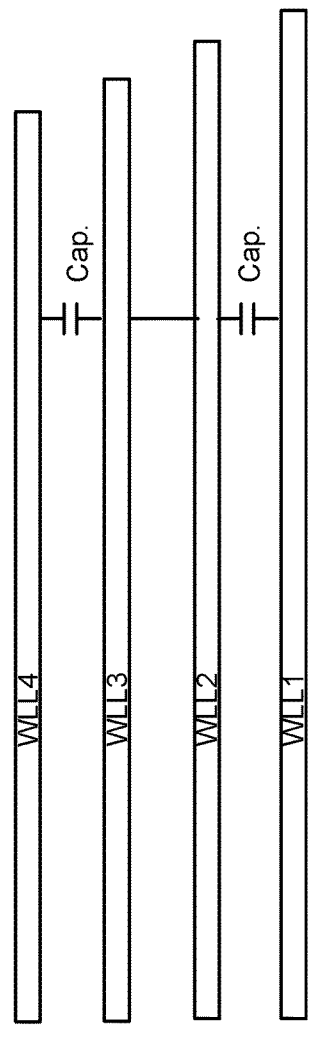
FIG. 17B depicts example word line layers WLL1-WLL4, showing how a reduced capacitance exists when adjacent word line layers are connected.

FIG. 17B depicts example word line layers WLL1-WLL4, showing how a reduced capacitance exists when adjacent word line layers are connected. When adjacent word lines are electrically connected, there is no capacitance between them. In this example, a desired change in the voltage of WLL3 is slowed by its capacitance with WLL4, but not by a capacitance with WLL2, since WLL3 and WLL2 are connected. The reduction in capacitance along with the reduced resistance help reduce the RC time constant and the time used for a voltage change.

One option is to connect non-adjacent word lines in a block through a permanent (non-switched) or switched path. This approach obtains the benefit of a reduced RC time constant due to a reduced resistance. Although, there may be more complexity in providing a path between non-adjacent word lines, compared to providing a path between adjacent word lines.

Figure 18:
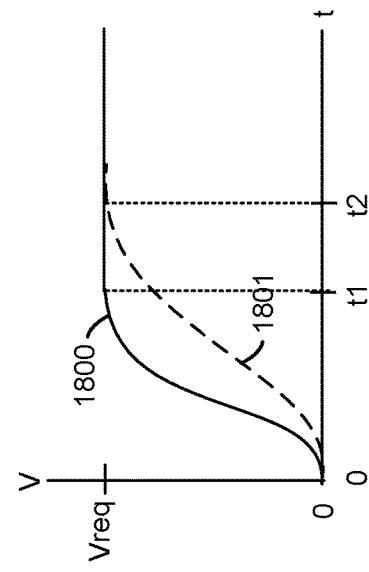
FIG. 18 depicts a plot of a voltage versus time, showing a relatively fast increase and a relatively slow increase.

FIG. 18 depicts a plot of a voltage versus time, showing a relatively fast increase and a relatively slow increase. At t0, a controller commands a voltage driver to change its output from 0 V to Vreq, a requested voltage. When the voltage driver is connected to a word line, the time to change the voltage is affected by the RC time constant of the word line. In one example (plot 1800), the increase occurs relatively quickly, in a time period t1. In another example (plot 1801), the increase occurs relatively slowly, in a time period t2. The voltage timing circuit 117*a* (FIG. 1) can allocate a time for changing a word line voltage based on knowing whether the word line is connected to another word line. If the word line is connected, a shorter access time (e.g., t1) can be allocated. If the word line is not connected, a longer access time (e.g., t2) can be allocated. The allocated time period can be set for various changes in a voltage signal which occur during a program or read operation, for example. See FIGS. 20 and 21, for example. Different allocated time period can be set for a same change in a voltage signal, for connected and disconnected word lines.

A relatively high access speed is obtained by allocating a relatively short time period to change a voltage on a word line, while a relatively low access speed is obtained by allocating a relatively long time period to change a voltage (e.g., by a same amount) on a word line.

Figure 19:
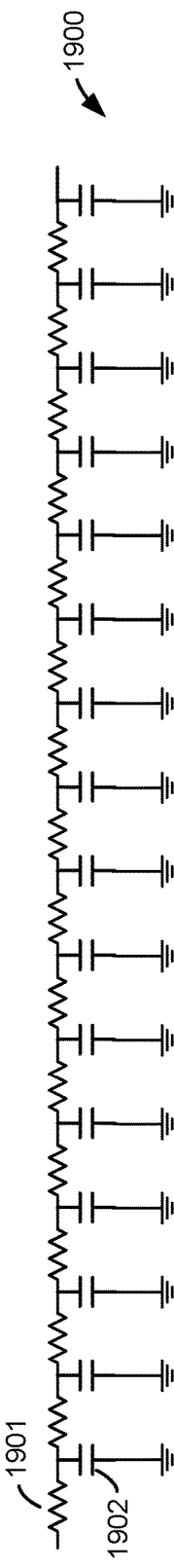
FIG. 19 depicts a model of a word line as a distributed RC network 1900, consistent with FIG. 16E.

FIG. 19 depicts a model of a word line as a distributed RC network 1900, consistent with FIG. 16E. The memory cells in a NAND string are connected in series and can be represented by a series of resistors (see example resistor 1901) and a capacitor between each resistor (see example capacitor 1902). The RC time constant of a portion of a word line is proportional to $1/N^2$, where N is the number of memory cells in the portion. Thus, a time constant for changing a magnitude of a voltage signal for one half of the memory cells connected to a word line is one fourth the time constant for changing the magnitude of the voltage signal for all of the memory cells connected to the word line. Accordingly, a high access speed can be achieved by limiting the access to a portion of the word line which is closest to the row decoder or other voltage source.

FIG. 20 depicts examples of voltage signals which can be used in a program loop of a program operation, consistent with FIG. 11D. In FIGS. 20 and 21, the vertical dimension denotes voltage and the horizontal dimension denotes time, with time points t0-t16. The period of time depicted corresponds to one program loop and includes a pre-charge phase 2087 (t0-t3), a program phase 2088 (t3-t9) and a verify phase 2089 (t9-t16). Example voltages of the signals are also depicted. A voltage signal 2000 represents VWLn/VWLadj, the voltage of the selected word line and an adjacent word line, a voltage signal 2010 represents Vwl_unsel, a voltage of remaining unselected word lines, a voltage signal 2030 represent the select gate voltages, e.g., Vsgd and/or Vsgs, and a voltage signal 2040 represents Vbl, a bit line voltage. VWLn/VWLadj is an example of a single voltage signal which is passed to a selected word line and an adjacent word line as a common voltage signal.

The voltage signal 2000 is represented by a plot 2001 at an initial value such as 0 V, a plot 2002 representing a first step increase in WLn, from the initial value to an intermediate value, e.g., Vpass, a plot 2003 in which WLn is held at Vpass, a plot 2004 representing a second step increase, from Vpass to Vpgm, a plot 2005 representing a holding period at Vpgm, a plot 2006 representing a decrease from Vpgm to the initial value, and a plot 2007 representing verify voltages of VvE, VvF and VvG, for example.

The voltage signal 2000 includes options for using a voltage kick, as mentioned. For example, a plot 2003a depicts a voltage kick in which a voltage at a magnitude of Vpass+d is requested at t3, where d is a delta. The requested voltage is then lowered to Vpass at t5. A plot 2005a depicts a voltage kick in which a voltage at a magnitude of Vpgm+d is requested at t6. The requested voltage is then lowered to Vpgm at t7a.

During the verify phase, a voltage kick can be used for one or more of the verify voltages VvE, VvF and VvG. For example, a plot 2007a depicts a voltage kick in which a voltage at a magnitude of VvE+d is requested at t10. The requested voltage is then lowered to VvE at t11. A plot 2007b depicts a voltage kick in which a voltage at a magnitude of VvF+d is requested at t12. The requested voltage is then lowered to VvF at t13. A plot 2007c depicts a voltage kick in which a voltage at a magnitude of VvG+d is requested at t14. The requested voltage is then lowered to VvG at t15.

The value d can be different for the different voltage kicks which are depicted. As mentioned, the peak voltage could be, e.g., up to 10-30% higher than the final voltage. During a program operation, examples of a final voltage include Vpass and Vpgm during the program phase, and a verify voltage such as VvE, VvF or VvG during the verify phase. During a read operation, examples of a final voltage include a read voltage such as VrA and VrE in FIGS. 9B and 21, and Vr in FIG. 9A.

As mentioned, a relatively short time period can be allocated for changing a voltage on a selected word line connected to an adjacent word line, due to the lower RC time constant. During a program operation, example time periods which are allocated for a voltage increase of VWLsel and VWLadj are t3-t4 (increase from an initial voltage to Vpass), t6-t7 (increase from a Vpass to Vpgm), t10-t11 (increase from an initial voltage to VvE), t12-t13 (increase from VvE to VvF), and t14-t15 (increase from VvF to VvG). Relatively shorter time periods can also be allocated for a voltage decrease, such as at t8.

The voltage signal 2010 is represented by a plot 2011 at an initial value such as 0 V, a plot 2012 representing an increase in Vwl_unsel from the initial value to a pass value, e.g., Vpass, and a plot 2013 in which Vwl_unsel is held at Vpass from t3-t4.

The voltage signal 2030 is represented by a plot 2031 during the pre-charge for selected and unselected select gate transistors. The selected select gate (SG) transistors are in a selected sub-block (a sub-block selected for programming), and the unselected SG transistors are in unselected sub-blocks (sub-blocks which are not selected for programming) Subsequently, a plot 2032 with Vsg_sel=2.5 V represents the voltage of the selected SG transistors, and a plot 2033 with Vsg_unsel=2.5 V represents the voltage of the unselected SG transistors.

The voltage signal 2040 is represented by a plot 2041, depicting a voltage Vb1=2 V, during the pre-charge for selected and unselected bit lines. The selected and unselected bit lines are connected to selected and unselected NAND strings, respectively, in a selected sub-block, in one approach. Subsequently, a plot 2042 depicts Vbl_unsel=2 V (a voltage on unselected bit lines), and a plot 2043 depicts Vbl_sel=0 V (a voltage on selected bit lines).

In the pre-charge phase, a positive Vbl (plot 2041) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 2031) to allow the source line voltage (Vsl) to be passed to the source end of the channel.

In the program phase, VWLn and Vwl_unsel are ramped up, e.g., starting at t2, to provide a capacitive coupling up of the channels of the unselected NAND strings. VWLn is then ramped up further at t6-t7 to the peak program pulse level of Vpgm and held at Vpgm until t8. After the program pulse, VWLn is ramped down to Vss (0 V) at t8. Subsequently, in the verify phase, one or more verify tests are performed by applying one or more control gate read voltages (plot 2007) on WLn and, for each read voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 2032) and the unselected sub-blocks (plot 2033). During the program pulse, with Vbl=0 V (plot 2043), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 2042). Vbl_sel can be increased during the verify phase as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t16, Vbl is decreased to 0 V so that the SGD transistors are cutoff and the channel region has a floating voltage.

FIG. 21 depicts examples of voltage signals which can be used in a read operation, consistent with FIG. 11G. A plot 2050 represents VWLsel/VWLadj. In this example, the read operation include two read voltages, VrA and VrE, which are used to read a lower page of data, in a configuration using MLC memory cells with eight data states. The voltage increases from an initial voltage such as 0 V to VrA at t2, and from VrA to VrE at t6. A plot 2050a depicts a voltage kick in which a voltage at a magnitude of VrA+d is requested at t2. The requested voltage is then lowered to VrA at t3. A plot 2050b depicts a voltage kick in which a voltage at a magnitude of VrE+d is requested at t6. The requested voltage is then lowered to VrE at t7.

A plot 2060 represents Vwl_unsel, the voltage on the remaining word lines. Vwl_unsel increases from an initial voltage to Vpass at t2, is held at Vpass until t10, and then decreases back to the initial voltage.

A plot 2070 represents Vsg, the voltage on the SGD and SGS transistors. Referring to plot 2071 which is used for the selected sub-block, Vsg increases from an initial voltage to a turn on level such as 6 V at t2, is held at that level until t10, and then decreases back to the initial voltage. Vsg is high enough to provide the SGD and SGS transistors in a strongly conductive state to allow sensing to occur. For the unselected sub-blocks, plot 2072 shows that Vsg may be set to 0 V to keep the SGD and SGS transistors in a non-conductive state so that they do not interfere with sensing of the selected sub-block.

A plot 2080 represents Vbl, the bit line voltage. Vbl increases from an initial voltage to a positive voltage such as 2 V at t2, is held at that level until t10, and then decreases back to the initial voltage.

A plot 2080 represents Vsense, a voltage in a sense node of a sense circuit. Vsense increases from an initial voltage to a positive voltage such as 2 V at t2. At t4, the sense node is allowed to communicate with the bit line when VrA is applied. An amount of decay in the sense node is determined to evaluate whether a memory cell is in a conductive or non-conductive state. If the memory cell has VrA>Vth and is therefore in a conductive state, plot 2093 shows that the sense node voltage will decay below a trip voltage, Vtrip at a sense time t5. If the memory cell has VrA≤Vth and is therefore in a non-conductive state, plot 2091 shows that the sense node voltage will not decay significantly at the sense time t5.

Similarly, at t8, the sense node is allowed to communicate with the bit line when VrE is applied. If the memory cell has VrE>Vth and is therefore in a conductive state, plot 2094 shows that the sense node voltage will decay below a trip voltage, Vtrip at a sense time t9. If the memory cell has VrE≤Vth and is therefore in a non-conductive state, plot 2092 shows that the sense node voltage will not decay significantly at the sense time t5.

Sensing of a SLC memory cell can proceed similarly except that VWLsel/VWLadj is set to a single read voltage of Vr (FIG. 9A).

As mentioned, a relatively short time period can be allocated for changing a voltage on a selected word line connected to an adjacent word line, due to the lower RC time constant. During a read operation, example time periods which are allocated for a voltage increase of VWLsel and VWLadj are t2-t3 (increase from an initial voltage to a first read voltage), and t6-t7 (increase from a first read voltage to a second read voltage), for MLC memory cells. For a read of SLC memory cells, an example time period is allocated for a voltage increase of VWLsel and VWLadj from 0 V or other initial voltage to Vr. Relatively shorter time period periods can also be allocated for a voltage decrease on a selected word line connected to an adjacent word line.

In one implementation, an apparatus comprises: a set of memory cells connected to a plurality of word lines; a row decoder; and a word line activation circuit configured to, in response to a command involving a selected word line of the plurality of word lines, activate the row decoder to pass a common voltage signal to the selected word line and an adjacent word line.

In another implementation, a method comprises: in response to a command to perform an operation on memory cells connected to a first selected word line, increasing a voltage of a common voltage signal on the first selected word line and an adjacent word line from an initial voltage to a final voltage; and in response to a command to perform an operation on memory cells connected to a second selected word line, increasing a voltage on the second selected word line from the initial voltage to the final voltage, a time period allocated for the changing of the voltage of the first selected word line and the adjacent word line is less than a time period allocated for the changing of the voltage of the second selected word line.

In another implementation, an apparatus comprises: a set of memory cells connected to a first word line in a block; a set of memory cells connected to a second word line in the block; and means for concurrently programming data into the set of memory cells connected to the first word line and the set of memory cells connected to the second word line.

The means for concurrently programming data may include the controller 122, control circuitry 110, row decoder 124 and read/write circuits 128 of FIG. 1-3, or other logic hardware, and/or other executable code stored on a computer readable storage medium or device. Other embodiments may include similar or equivalent means.

In another implementation, an apparatus comprises: a first row decoder for a first block; a second row decoder for a second block; a set of bit lines shared by the first block and the second block; and a control circuit configured to access memory cells in the first block which extend to a first distance from the first row decoder using a first access time, and to access memory cells in the second block which extend to a second distance from the second row decoder using a second access time, the first distance is less than the second distance, and the first access time is less than the second access time.

In another implementation, a system comprises: a controller; and a memory die connected to the controller. The memory die comprises: a first row decoder for a first block; memory cells in the first block which extend to a first distance from the first row decoder; memory cells in the first block which extend beyond the first distance from the first row decoder, the memory cells in the first block which extend to the first distance and the memory cells in the first block which extend beyond the first distance are connected to a group of adjacent word lines connected to one another; and a control circuit configured to access the memory cells which extend to the first distance in a first access time period and to access the memory cells which extend beyond the first distance in a second access time period, greater than the first access time period.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of memory cells connected to a plurality of word lines;
   a row decoder; and
   a word line activation circuit configured to, in response to a command involving a selected word line of the plurality of word lines, activate the row decoder to pass a common voltage signal to the selected word line and an adjacent word line, wherein the plurality of word lines are in a block and comprise a word line not connected to an adjacent word line, and a number of bits stored per memory cell for the word line not connected to an adjacent word line is greater than a number of bits stored per memory cell for the selected word line and its adjacent word line.

2. The apparatus of claim 1, wherein:
   the row decoder is configured to pass a single voltage signal to the selected word line and the adjacent word line as the common voltage signal.

3. The apparatus of claim 1, further comprising:
   a switch configured to connect the selected word line and the adjacent word line.

4. The apparatus of claim 1, wherein:
   the word line activation circuit is configured to detect a short circuit between the selected word line and the adjacent word line.

5. The apparatus of claim 1, further comprising:
   a first via extending upwards from the selected word line to a contact; and
   a second via extending upwards from the adjacent word line to the contact, the contact connected to the row decoder.

6. The apparatus of claim 1, wherein the set of memory cells are connected to the plurality of word lines in a first block, the apparatus further comprising:
   a set of memory cells connected to a plurality of word lines in a second block, wherein the plurality of word lines in the second block comprise word lines disconnected from adjacent word lines, and the first block and the second block share a common set of bit lines.

7. The apparatus of claim 6, wherein:
   a number of bits stored per memory cell for the set of memory cells connected to the plurality of word lines in the second block is greater than a number of bits stored per memory cell for the selected word line and its adjacent word line.

8. The apparatus of claim 6, wherein:
   the word line activation circuit is configured to allocate a time period for changing a voltage on the selected word line and the adjacent word line which is less than a time period allocated for changing a voltage on one of the word lines in the second block.

9. The apparatus of claim 1, wherein:
   the word line activation circuit is configured to allocate a time period for changing a voltage on the selected word line and the adjacent word line which is less than a time period allocated for changing a voltage on the word line not connected to an adjacent word line.

10. The apparatus of claim 1, wherein:
    the command comprises a program command; and
    the selected word line and the adjacent word line comprise adjacent memory cells in a NAND string which are programmed to a common data state.

11. The apparatus of claim 1, wherein:
    the command comprises a sensing command; and
    the selected word line and the adjacent word line comprise adjacent memory cells in a NAND string which are sensed as being in a common data state.

12. The apparatus of claim 1, wherein:
    the word line activation circuit is configured to activate the row decoder to pass the common voltage signal to a group of at least three adjacent word lines comprising the selected word line and the adjacent word line.

13. A method, comprising:
    in response to a command to perform an operation on memory cells connected to a first selected word line, increasing a voltage of a common voltage signal on the first selected word line and an adjacent word line from an initial voltage to a final voltage; and
    in response to a command to perform an operation on memory cells connected to a second selected word line, increasing a voltage on the second selected word line from the initial voltage to the final voltage, a time period allocated for the increasing of the common voltage signal on the first selected word line and the adjacent word line is less than a time period allocated for the increasing of the voltage of the second selected word line.

14. The method of claim 13, wherein:
    the first selected word line and the adjacent word line comprise adjacent memory cells in a NAND string which are programmed to a common data state.

15. The method of claim 13, wherein:
    the first selected word line, the adjacent word line and the second word line are in a block.

16. An apparatus, comprising:
    a set of memory cells connected to a first word line in a block;
    a set of memory cells connected to a second word line in the block; and
    means for concurrently programming data into the set of memory cells connected to the first word line and the set of memory cells connected to the second word line.

17. The apparatus of claim 16, wherein:
    the means for concurrently programming applies a common program voltage signal to the set of memory cells connected to the first word line and the set of memory cells connected to the second word line.

18. The apparatus of claim 16, wherein:
    the means for concurrently programming increases a voltage on the first word line without a voltage kick while increasing a voltage on the second word line with a voltage kick.

19. An apparatus, comprising:
    a first row decoder for a first block;
    a second row decoder for a second block;
    a set of bit lines shared by the first block and the second block; and
    a control circuit configured to access memory cells in the first block which extend to a first distance from the first row decoder using a first access time, and to access memory cells in the second block which extend to a second distance from the second row decoder using a second access time, the first distance is less than the second distance, and the first access time is less than the second access time, wherein the memory cells in the first block are connected to a group of adjacent word lines connected to one another, and the memory cells in the second block are connected to a single word line which is disconnected from adjacent word lines.

20. The apparatus of claim 19, wherein:
the first access time is a time allocated for increasing a voltage of the group of adjacent word lines from an initial voltage to a program voltage; and
the second access time is a time allocated for increasing a voltage of the single word line from the initial voltage to the program voltage.

21. The apparatus of claim 19, wherein:
memory cells in the first block which extend beyond the first distance from the first row decoder are ineligible to store data.

22. A system, comprising:
a controller; and
a memory die connected to the controller, the controller is external to the memory die, the memory die comprises:
a row decoder for a block;
a group of word lines;
memory cells in the block which extend to a first distance from the row decoder;
memory cells in the block which extend beyond the first distance from the row decoder, comprise one half of the block, and are ineligible to store data, the memory cells in the block which extend to the first distance and the memory cells in the block which extend beyond the first distance and are ineligible to store data are connected to the group of word lines; and
a control circuit configured to access the memory cells which extend to the first distance in a first access time period.

23. The system of claim 22, wherein:
the accessing of the memory cells which extend to the first distance comprises reading the memory cells which extend to the first distance without reading the memory cells in the block which extend beyond the first distance and are ineligible to store data.

\* \* \* \* \*